(12) United States Patent
Glattli et al.

(10) Patent No.: US 10,341,150 B2
(45) Date of Patent: Jul. 2, 2019

(54) METHOD AND DEVICE FOR PHASE MODULATION OF A CARRIER WAVE AND APPLICATION TO THE DETECTION OF MULTI-LEVEL PHASE-ENCODED DIGITAL SIGNALS

(71) Applicant: Commissariat A L'Energie Atomique Et Aux Energies Alternatives, Paris (FR)

(72) Inventors: Denis Christian Glattli, Antony (FR); Séverin Preden Roulleau, Paris (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 15/548,519

(22) PCT Filed: Jan. 29, 2016

(86) PCT No.: PCT/FR2016/050193
§ 371 (c)(1),
(2) Date: Aug. 3, 2017

(87) PCT Pub. No.: WO2016/124841
PCT Pub. Date: Aug. 11, 2016

(65) Prior Publication Data
US 2018/0227154 A1 Aug. 9, 2018

(30) Foreign Application Priority Data
Feb. 3, 2015 (FR) ..................... 15 50809

(51) Int. Cl.
*H04L 27/20* (2006.01)
*H04L 27/22* (2006.01)
(Continued)

(52) U.S. Cl.
CPC .......... *H04L 27/2017* (2013.01); *H03C 1/52* (2013.01); *H04L 27/0008* (2013.01);
(Continued)

(58) Field of Classification Search
CPC ... H03C 1/52; H04L 27/2017; H04L 27/0008; H04L 27/04; H04L 27/10; H04L 27/20; H04L 27/22; H04L 27/32
See application file for complete search history.

(56) References Cited

U.S. PATENT DOCUMENTS

| 1,449,382 A | 3/1923 | Carson |
| 1,666,206 A | 4/1928 | Hartley |

(Continued)

OTHER PUBLICATIONS

Rowe et al.; "Power Spectrum of a Digital, Frequency-Modulation Signal"; 1975; The Bell System Technical Journal; pp. 1095-1125; vol. 54:6.

(Continued)

*Primary Examiner* — David S Huang
(74) *Attorney, Agent, or Firm* — The Webb Law Firm

(57) ABSTRACT

The method of phase modulating a carrier wave involves creating a set of signals $s_h(t)$ constituted by a carrier wave of frequency $f_C$ and of phase $\varphi(t)=h\varphi_0(t)$ that is modulated in time t in such a manner that $s_h(t)=\cos(2\pi f_C t+h\varphi_0(t))$, where h is an integer and where $\varphi_0(t)=2\arctan((t-t_0)/w_0)$. The modulation corresponds to a single phase pulse centered on a time $t_0$ of characteristic duration $w_0$ that is positive, and incrementing the phase of the signal $s_h(t)$ by the quantity $h2\pi$, in such a manner as to generate a single sideband frequency spectrum directly. The carrier wave may be of electromagnetic type or of acoustic type. The method applies in particular to transporting binary information by single sideband phase coding, to generating single sideband orthogonal signals, to detecting single sideband phase coded multiple-level digital signals, to transmitting single sideband phase coded binary signals in-phase and out-of-phase, and to single sideband combined amplitude-and-phase modulation.

9 Claims, 11 Drawing Sheets

(51) Int. Cl.

| | |
|---|---|
| *H04L 27/32* | (2006.01) |
| *H04L 27/00* | (2006.01) |
| *H04L 27/04* | (2006.01) |
| *H03C 1/52* | (2006.01) |
| *H04L 27/10* | (2006.01) |

(52) U.S. Cl.
CPC .............. *H04L 27/04* (2013.01); *H04L 27/10* (2013.01); *H04L 27/20* (2013.01); *H04L 27/22* (2013.01); *H04L 27/32* (2013.01)

(56) References Cited

U.S. PATENT DOCUMENTS

| | | | |
|---|---|---|---|
| 2,977,417 A | | 3/1961 | Doelz et al. |
| 3,204,034 A | | 8/1965 | Ballard et al. |
| 3,384,715 A | | 5/1968 | Higuchi et al. |
| 3,488,445 A | | 1/1970 | Chang |
| 2007/0092018 A1 | | 4/2007 | Fonseka et al. |
| 2012/0087403 A1 | | 4/2012 | Kim et al. |
| 2013/0215919 A1* | | 8/2013 | Aflatouni ............ H01S 5/06817 372/38.01 |
| 2013/0223459 A1* | | 8/2013 | Radic .................... G02F 1/3534 372/20 |
| 2013/0308123 A1* | | 11/2013 | Kishi .................... G01M 11/39 356/73.1 |
| 2014/0306101 A1* | | 10/2014 | Zornoza Indart .. G01D 5/35364 250/227.14 |

OTHER PUBLICATIONS

Weaver, Jr.; "A Third Method of Generation and Detection of Single-Sideband Signals"; 1956; Proceedings of the IRE; pp. 1703-1705.

* cited by examiner

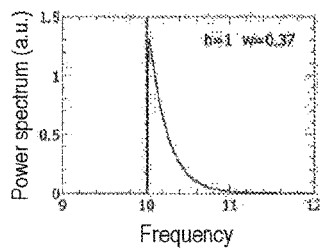 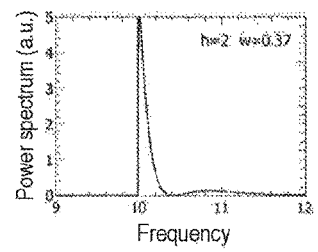 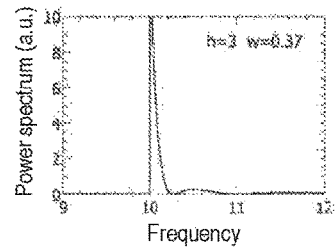
FIG.1A　　　　FIG.1B　　　　FIG.1C
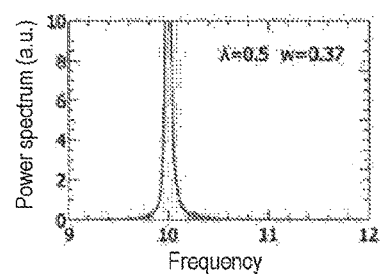 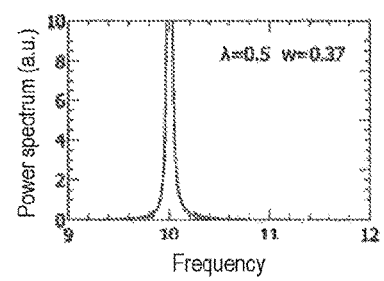
FIG.2A　　　　　　FIG.2B
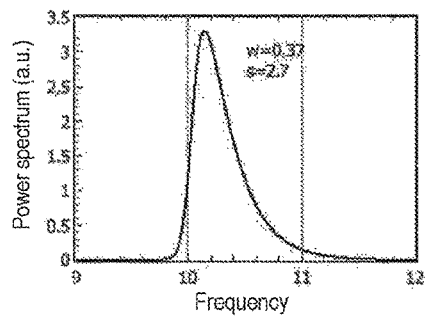 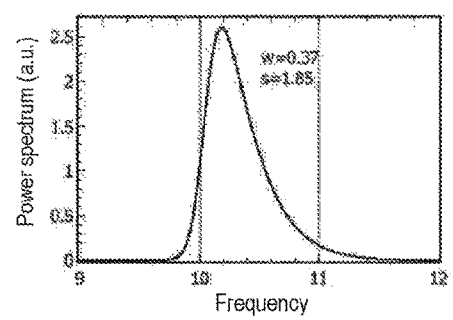
FIG.3A　　　　　　FIG.3B

METHOD AND DEVICE FOR PHASE MODULATION OF A CARRIER WAVE AND APPLICATION TO THE DETECTION OF MULTI-LEVEL PHASE-ENCODED DIGITAL SIGNALS

CROSS-REFERENCE TO RELATED APPLICATIONS

This application is the United States national phase of International Application No. PCT/FR2016/050193 filed Jan. 29, 2016, and claims priority to French Patent Application No. 1550809 filed Feb. 3, 2015, the disclosures of which are hereby incorporated in their entirety by reference.

FIELD OF THE INVENTION

The present invention relates to a method of phase modulating a carrier wave, which carrier wave may be of electromagnetic type, going from the low frequency range up to the optical range, or it may be of acoustic type.

The invention also applies to an application to a method of transporting binary data by single sideband (SSB) phase-coding.

The invention also relates to a method of generating single sideband orthogonal signals for a coding application, and to detecting SSB multi-level digital signals.

The invention also relates to a method of transmitting single sideband phase-coded binary signals in-phase and out-of-phase.

The invention also relates to an application to a single sideband combined amplitude-and-phase modulation method.

The invention also relates to devices for performing the above-specified methods.

PRIOR ART

From the earliest developments in telephony, followed by radio, signals for sending have been transported by means of amplitude or phase modulation of a sinusoidal carrier wave that is itself at a frequency higher than the spectrum range of the signals. In all the known methods, it is found that modulation generates a double sideband frequency spectrum, i.e. with frequency components above and below the carrier frequency. In general, the information contained in the upper sideband is the same as the information contained in the lower sideband.

Engineers have thus sought solutions for retaining only one sideband in order to optimize occupation of the allocated frequency band (in particular document U.S. Pat. No. 1,449,382). Specifically, if each user occupies a smaller amount of frequency space, then the number of users can be increased and costs per user can be reduced.

After generating the modulated signal, the usual method for obtaining a single sideband (SSB) consists in suppressing the unwanted sideband. The simplest technique is bandpass type filtering.

A method giving higher performance is filtering by means of the Hilbert transform. As proposed by Hartley as long ago as 1928 (see document U.S. Pat. No. 1,666,206), this uses a broadband 90° phase shifter to construct the sum (and also the difference) of the in-phase portion and the quadrature portion of the modulated signal in order to obtain the upper sideband (and also the lower sideband).

A variant was subsequently proposed by Weaver, in the article by D. K. Weaver Jr., entitled "A third method of generation and detection of single-sideband signals" published in "Proceeding of the IRE", pp 1703-1705, June 1956.

The Hilbert transform method is particularly appropriate nowadays because of the availability of digital signal processors (DSPs).

Furthermore, for numerous applications, it is desired to generate single sideband orthogonal signals.

The use of orthogonal waveforms has numerous applications, going from signal analysis to signal transmission. Under such circumstances, the intended application is data multiplexing. Initial approaches consisted in performing amplitude modulation on a carrier wave by means of a signal made up of the sum of orthogonal signals multiplied by the information bit to be transported.

The term "orthogonal" is used to mean that the integral of the product of two distinct waveforms is zero over a finite duration (specifically the time $T_s$ for transmitting a waveform coding one information bit (or "symbol")). An example of mutually orthogonal wave functions is given by the following set: $\sin 2 \cdot t/T_s$, $\sin 4 \cdot t/T_s$, $\sin 6 \cdot t/T_s$, etc, . . . .

Variants using the generation of orthogonal polynomials are described in document U.S. Pat. No. 3,204,034.

Variants have also been proposed using the generation of Hermite functions, e.g. as in document U.S. Pat. No. 3,384,715.

It may be observed that the above-mentioned modulation by sine functions also amounts to frequency modulation (and thus to phase modulation) where the frequency $f_C$ of the carrier takes the following values: $f_C \pm 1/T_s$, $f_C \pm 2/T_s$, $f_C \pm 3/T_s$, etc, . . . . This is the solution that has been developed the most in the field of digital data transmission. The method is known as "orthogonal frequency division multiplexing" (OFDM), and it is described in particular in document U.S. Pat. No. 3,488,445. By way of example, it is used in ADSL, in digital terrestrial radio or TV broadcasting, and more recently in 4G mobile networks.

Starting from a carrier frequency, use is made of a series of sub-carrier frequencies, each of which transports binary information. Each sub-carrier is the vector of a binary information channel, with simultaneous use of N sub-carriers making it possible to multiplex N bits. In this method, the signals carried by each of the sub-carriers need to present the property of orthogonality in order to avoid interference between channels and in order to make it possible, after demodulation, to retrieve the information from each channel.

Orthogonality is ensured if the distance between the sub-carrier frequencies is a multiple of the reciprocal of the symbol time $T_s$. During the transmission time $T_s$, the N-bit modulation signal that is transmitted in parallel is generated by the Fourier transform of the N bits and is then multiplied by the carrier frequency. On reception, after demodulating the carrier in order to retrieve the modulation signal, an inverse Fourier transform is applied thereto in order to retrieve the value carried by each of the N bits.

The methods described in the above paragraph all generate a double sideband signal. Orthogonal function generation also requires an analog or digital synthesis operation that is complex (multiple differentiations and sums for orthogonal polynomials or for Hermite functions, Fourier transforms for OFDM).

There also follows a brief history of phase coding.

Modern digital communications frequently make use of digital data transmission by a binary phase coding (or equivalently by phase shifting). Various different forms have been used.

The simplest, known as "binary phase shift keying" (B-PSK) consists in modulating the phase of a carrier by the quantity 0 or $\pi$. In order to transmit the $k^{th}$ bit of duration $T_b$ in the time interval $(k-1)T_b < t \le kT_b$, the phase takes the constant value $b_k\pi$ where $b_k=1$ for the bit '1' and $b_k=0$ for the bit '0'.

In order to achieve a better information transmission rate, the principal has been extended to quadrature phase shift keying (Q-PSK) where for even k the phase is $b_k\pi$ in the time interval $(k-1)T_b < t \le kT_b$ and for odd k, the phase is $\pi/2+b_k\pi$ in the shifted time interval $(k-\frac{1}{4})T_b < t \le (k+\frac{1}{4})T_b$.

Since the time discontinuities of the phase give rise to spectrum density tails that decrease only slowly on either side of the carrier frequency, gentler kinds of phase modulation have been introduced in order to obtain a spectrum that is more compact and thus reduce interference between independent digital signals transported by carriers of adjacent frequencies, e.g. as described in document U.S. Pat. No. 2,977,417.

For example, methods of coding by varying frequency, known as "frequency shift keying" (FSK), use linear interpolation of the phase variation over time (which amounts to shifting frequency, whence the term FSK). Phase is then continuous, but its derivative is not.

The modulation that is the most effective in this sense is obtained by "Gaussian minimum-shift keying" or (GMSK) and is used for example in GSM telephony (see for example the article by H. E. Rowe and V. K. Prabhu, entitled "Power spectrum of a digital, frequency-modulation signal", published in The Bell System Technical Journal, 54, No. 6, pages 1095-1125 (1975).

In that method, while transmitting a data bit, the derivative of the phase is a positive squarewave signal (bit 1) or a negative squarewave signal (bit 0) of duration $T_b$ convoluted with a Gaussian function in order to attenuate discontinuities. The phase of the carrier is then modulated by integrating its derivative and the amplitude of the phase increment is adjusted so as to have $+\pi/2$ for the 1 bit or $-\pi/2$ for the 0 bit. The GMSK method makes it possible to have a spectral extent that is very well contained, typically with spectral power reduced by $-20$ dB beyond the frequencies $f_c \pm \frac{1}{2}T_b$. This is shown in FIG. 4 where only the upper sideband of the double sideband spectrum is shown.

All of those methods give a double sideband spectrum.

OBJECT AND BRIEF SUMMARY OF THE INVENTION

As mentioned above, no known system of modulation presents the property of generating a single sideband directly. The term "directly" means generating without posttreatment as described above.

The present invention seeks to satisfy this shortcoming and to enable a single sideband modulated signal to be generated directly.

The invention addresses the problems of the prior art by a method of phase modulating a carrier wave, the method being characterized by creating a set of signals $s_h(t)$ constituted by a wave of carrier frequency $f_c$, and of phase $\varphi(t)=h\varphi_0(t)$ that is modulated in time t in such a manner that $s_h(t)=\cos(2\pi f_c t+h\varphi_0(t))$, where h is an integer and where $\varphi_0(t)=2\arctan((t-t_0)/w_0)$, the modulation corresponding to a single phase pulse centered on a time $t_0$, and of positive characteristic duration $w_0$, and incrementing the phase of the signal $s_h(t)$ by the quantity $h2\pi$, in such a manner as to generate a single sideband frequency spectrum directly.

The carrier wave may be of electromagnetic type, from low frequencies up to optical frequencies, or it may be of acoustic type.

The invention also provides a method of transporting binary information by single sideband phase coding by applying the method of modulation of the invention, characterized by, for binary coding the phase, either establishing that the $k^{th}$ bit of duration $T_b$ contributes the quantity $2b_k \arctan((t-kT_b)/w)$ to the total phase $\varphi(t)$ of the carrier, where $b_k=1$ or 0, and where the width w is comparable to or smaller than the symbol duration $T_b$, or else considering that the derivative of the phase is a sum of Lorentzian functions $2w/((t-kT_b)^2+w^2)$ centered on $kT_b$ and weighted by the bit $b_k$, and then integrating the phase, which is then added to the carrier using a phase modulation method, the quantities $\cos\varphi(t)$ and $\sin\varphi(t)$, which are the in-phase and quadrature components of the modulation signal, being calculated and combined with the in-phase amplitude $\cos 2\pi f_c t$ and the quadrature amplitude $\sin 2\pi f_c t$ of the carrier in order to obtain the signal for transmission in the form:

$s(t)=\cos(2\pi f_c t+\varphi(t))=\cos(2\pi f_c t)\cos\varphi(t)-\sin(2\pi f_c t)\sin\varphi(t)$.

The invention also provides a method of generating single sideband orthogonal signals by applying the method of modulation of the invention, characterized by, for generating a set of orthogonal functions $u_h(t)$, h=1, 2, 3, ..., N over a finite duration $T_b$ for use in transmitting data at a rate of $1/T_b$ per data channel, initially either considering the situation in which $T_b$ is infinite, thereby defining a single pulse, and establishing a base of orthogonal functions of the form:

$$u_h(t) = \frac{1}{\sqrt{2\pi}} e^{ih\varphi_0(t)} \sqrt{\frac{d\varphi_0(t)}{dt}} = \frac{1}{\sqrt{2\pi}} \frac{(t+iw)^{h-1}}{(t-iw)^h}$$

where the phase is $\varphi_0(t)=2\arctan(t/w)$, or else considering the signals $$s_h(t) = e^{ih\varphi_0(t)} = \frac{(t+iw)^h}{(t-iw)^h}$$

and then ensuring that the two signals $s_h(t)$ and $s_{h'}(t)$ are orthogonally separated by performing the following integration:

$$\frac{1}{2\pi}\int_{-\infty}^{+\infty} s_{h'}^*(t)s_h(t)\frac{d\varphi_0}{dt}dt = \delta_{h,h'}$$

where $\frac{d\varphi_0}{dt} = 2w/(t^2+w^2)$ appears as a weight for the integration, the signals $s_h(t)$ being at constant amplitude, and the spectrum of the signals $s_h(t)$ being a single sideband spectrum.

In a particular aspect of this method, it involves generalizing to orthogonal functions over a time interval $T_b$ that is no longer infinite, but rather finite, by considering a periodic series of phase pulses spaced apart by the duration $T_b$ in order to obtain periodic signals of the following form:

$$s_h(t) = e^{ih\varphi_0(t,T_b)} = \left(\frac{\sin(\pi(t+iw)/T_b)}{\sin(\pi(t-iw)/T_b)}\right)^h;$$

where the derivative of the phase $\varphi_0$ is a periodic sum of Lorentzian functions, which sum may be rewritten as a periodic function having the form:

$$\frac{d\varphi_0}{dt} = \frac{\pi}{T_b} \cdot \frac{sh(2\pi w/T_b)}{\sin^2(\pi t/T_b) + sh^2(\pi w/T_b)}$$

where two signals differing by the integers h and h' satisfy an orthogonality relationship over the time interval $T_b$:

$$\frac{1}{2\pi} \int_{-T_b/2}^{+T_b/2} s_{h'}^*(t)s_h(t)\frac{d\varphi_0}{dt} = \delta_{h,h'}; \quad \frac{d\varphi_0}{dt}$$

acting as a weight for the integration, such that by calculating $$\frac{d\varphi_0}{dt}$$

and then proceeding with integration in order to obtain the phase $\varphi_0(t,T_b)$ before synthesizing the signal $s_h(t)=e^{ih\,\varphi_0(t,T_b)}$, a constant amplitude signal set is obtained presenting the characteristic of orthogonality, and a discrete spectrum is obtained that conserves the single sideband property, merely by performing a simple multiplication of the phase by an integer.

The method of the invention is thus a novel method of phase modulation that differs in that it generates orthogonal signals with a single sideband spectrum and in that the orthogonal functions used of order N>1 are generated merely by multiplying the phase that was used for generating the orthogonal function of order 1 by an integer.

Whereas OFDM presents a double sideband spectrum of width $N/T_s$ flanked by spectrum tails that decrease slowly (power law), the invention proposes spectrum multiplexing that has no lower sideband and in which the upper sideband has a main width $N/T_s$ with a rapidly exponentially decreasing spectrum tail.

It is naturally also possible, by inverting the sign of the phase, to perform spectrum multiplexing that has no upper sideband and for which the lower sideband that has a main width $N/T_s$ with a rapidly exponentially decreasing spectrum tail.

The invention also provides a method of transmitting single sideband phase-coded binary signals in-phase and out-of-phase by applying the method of modulation of the invention, characterized in that it involves independently modulating the in-phase component and the quadrature component of the carrier in order to double the bit rate, the signal under consideration having the following form and being constituted by the sum of two amplitudes and not being of constant amplitude:

$$s(t)=\cos(2\pi f_C t+\varphi_1(t))+\sin(2\pi f_C t+\varphi_2(t))$$

with the phases $$\varphi_1(t) = \sum_k b_{k,1}\varphi_0(t-kT_b) \text{ and } \varphi_2(t) = \sum_k b_{k,2}\varphi_0(t-kT_b),$$

where two independent sets of bits $b_{k,1(2)}$ are used to double the bit rate, the spectrum of each of the out-of-phase and in-phase amplitudes being a single sideband spectrum, the total signal itself presenting the single sideband property.

The invention also provides a method of combined modulation of the signal of a carrier combining both amplitude modulation and phase modulation by applying the method of modulation of the invention, characterized in that for pulses where the phase is expressed in the form $\varphi(t)=h\varphi_0(t)$ (h=1, 2, 3, . . . ), the method involves producing a signal of the form:

$$s(t)=\cos(2\pi f_C t)-(-1)^h \cos(2\pi f_C t+h\varphi_\alpha(t))$$

where the resulting spectrum is a single sideband spectrum.

The invention also provides a device for generating single sideband phase pulses for performing the method of the invention, characterized in that it comprises a dedicated fast DSP processor or a reconfigurable fast FPGA processor, a digital-to-analog converter, first and second modules respectively for determining the quantities $\sin \varphi(t)$ and $\cos \varphi(t)$, first and second mixers for multiplying the in-phase part and the phase quadrature part of the wave of carrier frequency $f_C$ respectively by said quantities $\sin \varphi(t)$ and $\cos \varphi(t)$, and an adder circuit for combining the signals delivered by said first and second mixers.

More particularly, the invention also provides a device for generating single sideband phase pulses for performing the method of the invention, characterized in that it comprises an analog device for generating 2N periodic sequences of pulses $d\varphi_{0,s}(t)/dt$ of period $2NT_b$, each sequence being offset in time from the preceding sequence by $T_b$, the analog device using an elementary phase $\varphi_{0,s}(t)$ such that the overlap between the phase pulses separated by $2NT_b$, is negligible, in order to synthesize $d\varphi(t)/dt$, and a device for generating frequency harmonics that are multiples of $\frac{1}{2}NT_b$ in order to synthesize a periodic sequence of signals $$d\varphi_{0,s}^q(t)/dt = \sum_{k=-\infty}^{+\infty} d\varphi_{0,s}(t-(k+q)T_b)/dt, \quad -N \leq q < N;$$

and a demultiplexer configured to act in the time interval $$(k-N+\tfrac{1}{2})/2T_b \leq t < (k+N-\tfrac{1}{2})/T_b;$$

to demultiplex bits in order to index them as $b_{k+q}$, and by using the gate function $\Pi(t)$ of width $2NT_b$ it is possible to construct the total phase derivative:

$$d\varphi(t)/dt = \sum_{q=-N}^{+N} b_{k+q} \prod (t-(k+q)T_b) d\varphi_{0,s}(t-(k+q)T_b)/dt.$$

The invention also provides a device for demodulating a single sideband phase coded signal, characterized in that it comprises a local oscillator of frequency $f_C$, first and second mixers, and a 0°-90° phase shifter for obtaining respectively the in-phase and quadrature components $\cos(\varphi(t))$ and $\sin(\varphi(t))$ of the modulation signal, a module for differentiating each of the in-phase and quadrature components $\cos(\varphi(t))$ and $\sin(\varphi(t))$ of the modulation signal and for multiplying each of the derivatives obtained by the other one of the in-phase and quadrature components $\cos(\varphi(t))$ and $\sin(\varphi(t))$ of the modulation signal in order to obtain the phase derivative:

$$d\varphi/dt=\cos \varphi(t)d(\sin \varphi(t))/dt-\sin \varphi(t)d(\cos \varphi(t))/dt;$$

and a module for reconstituting an initially generated series of Lorentzian function pulses, the module comprising a threshold detector with a value of half the amplitude of a single Lorentzian function pulse so as to discriminate the value of a bit $b_k=1$ or 0 at a time $t_k=kT_b$.

The invention also provides a device for demodulating signals by a base of orthogonal periodic signals comprising four amplitude levels including zero amplitude, characterized in that it comprises a local oscillator of frequency $f_C$, first and second mixers, and a 0°-90° phase shifter serving to obtain respectively the in-phase and quadrature components $\cos(\varphi(t))$ and $\sin(\varphi(t))$ of the modulation signal, a device for separately detecting the four levels h=0, 1, 2, and 3 of quaternary bits by using a demodulation module associated with a Lorentzian function generator of period $T_b$, to form the following two quantities for each of the four amplitude levels:

$$R_h(t) = (\cos(\varphi(t) - h\varphi_0(t, T_b)))\frac{d\varphi_0}{dt} \text{ and}$$

$$I_h(t) = (\sin(\varphi(t) - h\varphi_0(t, T_b)))\frac{d\varphi_0}{dt}$$

a device for determining the convolution with a gate function of time width $T_b$ giving:

$$\overline{R_h}(t) = \int_{t-T_b/2}^{t+T_b/2} R_h(t-\tau)d\tau \text{ and } \overline{I_h}(t) = \int_{t-T_b/2}^{t+T_b/2} I_h(t-\tau)dt$$

from the quantities $R_h(t)$ and $I_h(t)$, a device for calculating the quantity $\overline{R_h}(t)^2+\overline{I_h}(t)^2$, and a threshold detection device configured to determine that a peak observed in the quantity $\overline{R_h}(t)^2+\overline{I_h}(t)^2$ at an instant $t=kT_b$ for the level h=0, 1, 2, or else 3 indicates that the bit $b_k$ is equal to h.

The invention also provides a device for generating single sideband phase pulses in the optical domain, characterized in that it comprises a module for supplying data $b_k=1$ or 0, a Lorentzian function generator, a phase generator module, a phase integrator module, a laser generator for generating a carrier frequency, and an electro-optical phase modulator configured to modulate the phase of the wave directly in such a manner that, under the effect of a voltage proportional to the desired phase variation, an SSB phase modulation optical signal is generated in the modulator for transmission in an optical communications network.

BRIEF DESCRIPTION OF THE DRAWINGS

Other characteristics and advantages of the invention appear from the following description of particular implementations of the invention, given as examples, and with reference to the accompanying drawings, in which:

FIGS. 1A to 1C show curves plotting the spectrum density of single sideband spectra for signals corresponding to a single phase pulse and in which the carrier is phase modulated for different values of the integer number h defining the modulation index, in accordance with an aspect of the invention;

FIGS. 2A and 2B show curves plotting the spectrum density of signal spectra for carriers phase modulated with different values of a non-integer number defining the modulation;

FIGS. 3A and 3B show curves plotting the spectrum density of single sideband spectra of signals for which the carrier is phase modulated with different Gaussian values defining modulation presenting an SSB nature that is close to 100%, in accordance with an aspect of the invention;

DETAILED DESCRIPTION OF IMPLEMENTATIONS

Figure 4:
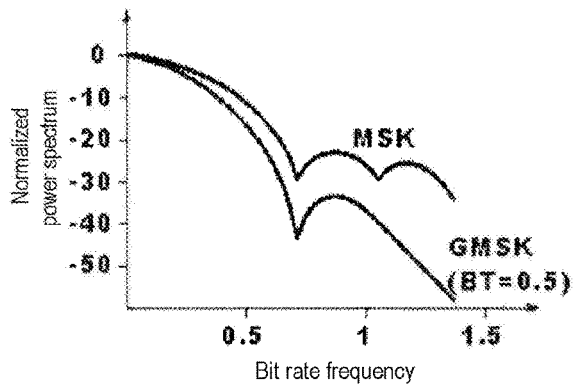
FIG. 4 shows curves plotting the relative amplitude of the signal as a function of frequency offset from a carrier defining a double sideband spectrum in accordance with the prior art.

The invention relates to a method of modulating waves. Firstly, by means of an original time increment to the phase of a carrier wave, the method makes it possible to generate directly a signal having a single sideband (SSB) frequency spectrum, i.e. a signal having its frequency content lying either above or else below the frequency of the carrier wave, but not on both sides simultaneously.

Secondly, by conserving the same time form for the phase increment, but by multiplying it by an integer, the method of the invention makes it possible to generate an original base of mutually orthogonal time signals that conserve the SSB property.

Furthermore, the resulting frequency spectrum is very compact with an exponential decrease in spectral power in the single sideband.

The method may be applied to waves of any type, e.g. electromagnetic waves (from the lowest frequencies to the optical range), or indeed to sound waves.

An immediate application lies with physically coding information by phase modulation for transmitting digital data (e.g. GSM, Bluetooth, Wi-Fi, digital TV, satellite communications, RFID, etc., . . . for the microwave range, or for example for high data rate transmission in the optical range).

The invention proposes a particular form of modulation for modulating the phase of a carrier wave that, on its own, is capable of generating a single sideband frequency spectrum.

Consideration is given to a set of signals $s_h(t)$ constituted by a carrier wave of frequency $f_C$, and of phase $\varphi(t)=h\varphi_0(t)$ that is modulated in time t:

$$s_h(t)=\cos(2\pi f_C t+h\varphi_0(t))$$

and where h is a positive integer or zero and where $\varphi_0(t)=2\arctan((t-t_0)/w_0)$.

The modulation corresponds to a single phase pulse centered on time $t_0$ of characteristic duration $w_0$ (>0) and incrementing the phase of the signal $s_h(t)$ by the quantity $h2\pi$.

With reference to the terminology used in the context of digital transmission based on phase modulation, h is known as the modulation index.

The spectrum density $P_h(f)=|\tilde{s}_h(f)|^2$ of the signal, where $\tilde{s}_h(f)$ is the Fourier transform of $s_h(t)$, is shown in FIGS. 1A to 1C for values of h respectively equal to 1, 2, and 3.

It can be seen that the spectrum is a single sideband spectrum: the spectrum does not have any component in the frequency band lower than $f_C$.

It should be observed that if the modulation index were selected so that h<0, then the spectrum would be a mirror image about the carrier frequency, and there would be no component in the upper band.

The choices for $t_0$ and $w_0$ can be arbitrary, but that does not change the single sideband property.

Explicitly, the spectrum density is given by a decreasing exponential multiplied by Laguerre polynomials $L_h(x)$ of degree h−1.

$$P_h(f)=[L_h(\pi(f-f_C)w)]^2 e^{-4\pi(f-f_C)w} \text{ if } f \geq f_C$$

$$P_h(f)=0 \text{ if } f<f_C$$

In remarkable manner, the single sideband spectrum is conserved when the phase variation is generalized to the increment sum $$\varphi(t)=\sum_i h_i\varphi_i(t),$$

where the $h_i$ are positive integers and $\varphi_i(t)=2\arctan((t-t_i)/w_i)$ with arbitrary $w_i>0$ and $t_i$.

The condition of having the same sign for all of the integers $h_i$ is mandatory for conserving the SSB property.

The form $$\varphi(t)=\sum_i h_i\varphi_i(t)$$

is taken advantage of and used below in application to examples relating to transporting binary information by single sideband phase coding.

There follow a few important properties of SSB phase modulation.

For a single phase pulse, only the generic form $\varphi_0(t)=2\arctan((t-t_0)/w_0)$ is capable of generating a single sideband, with arbitrary $t_0$ and $w_0$. Any other form of time variation will lead to a double sideband spectrum. The SSB property is conserved if the phase is a sum of phase pulses of form similar to $\varphi_0$ and of arbitrary width, generated at arbitrary instants, and multiplied by an arbitrary positive integer.

A single sideband spectrum that is a mirror image about the carrier frequency is obtained if the phase is of opposite sign.

The multiplicative factor h (and more generally all $h_i$, which must necessarily be of the same sign) must necessarily be an integer.

FIGS. 2A and 2B show that the spectra obtained for signals $s_\lambda(t)=\cos(2\pi f_C t+\lambda\varphi_0(t))$ where $\lambda$ (replacing h) is not an integer are spectra that are not single sideband.

Multiplying $\varphi_0$ by a positive integer makes it possible to generate a base of orthogonal functions, as explained below.

Also explained below are SSB criteria for kinds of modulation that, although not perfect, come close to perfect modulation and consequently likewise come within the ambit of the present invention.

Modulation for which the phase increment is not a multiple of $2\pi$, causes the second sideband to appear, even if the form of the modulation is unchanged, i.e. a Lorentzian function for the phase derivative. This is clearly apparent in FIGS. 2A and 2B.

In order to quantify the SSB nature, it is possible to define the ratio of the sum of the spectrum power for frequencies higher than the carrier divided by the sum of the total spectrum, as follows:

$$c_{SBB} = \int_{f_c}^{\infty} P(f) \Big/ \int_{-\infty}^{\infty} P(f).$$

In FIGS. 2A and 2B, for modulation with respectively λ=0.5 and 1.5 the following are found respectively $c_{SSB}$=56.9% and 61.7%, i.e. spectra that are very far from those expected for single sideband ($c_{SSB}$=100%).

In certain application examples, the phase variation $\varphi_0(t)$=2 arctan$((t-t_0)/w_0)$ may be considered as being too slow in order to reach the value 2π. Specifically: $\varphi_0(t)$≈π−πw/t, t→∞.

It may be useful to define an approximate form of $\varphi_0(t)$ in which the slow portion is truncated. That is done in the example described for an application to single sideband combined amplitude-and-phase modulation.

The Lorentzian function $d\varphi_0(t)/dt$ is multiplied by a Gaussian function of width s. The approximate phase derivative, written $\varphi_{0,s}(t)$ is then $$d\varphi_{0,s}(t)/dt = \mu \exp(-t^2/2s^2) 2w/(t^2+w^2)$$

where the parameter μ is a multiplier coefficient that makes it possible to conserve a total phase increment equal to 2π. The spectral power of $s(t)=\cos(2\pi f_C t + \varphi_{0,s}(t))$ is shown in FIGS. 3A and 3B for a Lorentzian function of width w=0.37 and for two Gaussian widths s=2.7 and 1.85 (respectively μ=1.112 and 1.165).

Since the derivative of the phase is now different from a Lorentzian function, a lower sideband appears. Nevertheless, values such that s>>w make it possible to conserve an SSB nature that is close to 100% ($c_{SSB}$=95.9% and 95% respectively).

There follows a description of an example of an application of the present invention to transporting binary information by single sideband phase coding.

Known phase coding methods are summarized above with reference to FIG. 4, and they all give rise to a double sideband spectrum.

In application of the present invention, there follows a description of the digital coding principle making use are single sideband phase modulation.

As an application of the present invention, consideration is given to the following phase coding: the $k^{th}$ bit of duration $T_b$ contributes to the total phase φ(t) of the carrier by the quantity 2 $b_k$ arctan$((t-kT_b)/w)$ where $b_k$=1 or 0 and the width w is comparable to or smaller than the symbol time $T_b$.

In practice, it is simpler to consider the derivative of the phase. This is then a sum of Lorentzian functions $2w/((t-kT_b)^2+w^2)$ centered on $kT_b$ and weighted by the bit $b_k$.

Figure 5A:
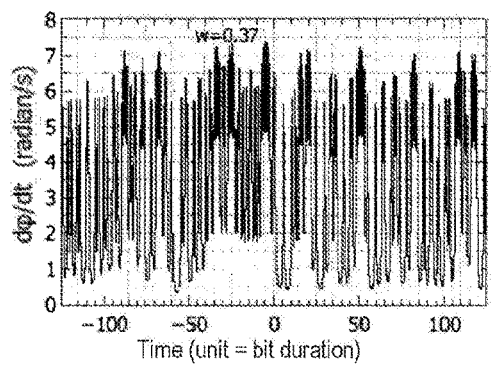
FIGS. 5A and 5B show, in the context of a digital coding method using single sideband phase modulation in accordance with the invention, curves plotting firstly the phase derivative signal as generated and secondly the phase signal as integrated.
Figure 5B:
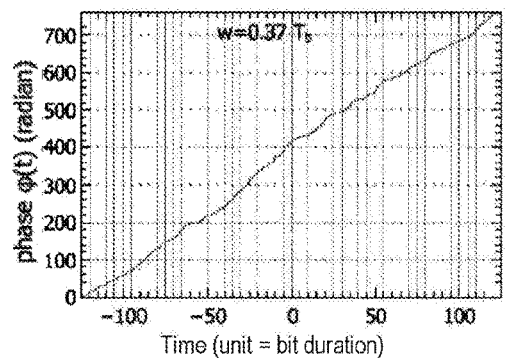

FIG. 5A shows the phase derivative signal that is generated. The phase is then integrated, as shown in FIG. 5B, and then applied to the carrier using a conventional phase modulation method.

The quantities cos φ(t) and sin φ(t) are calculated and combined with the in-phase and quadrature amplitudes cos $2\pi f_C t$ and sin $2\pi f_C t$ of the carrier in order to obtain the signal for transmission:

$$s(t)=\cos(2\pi f_C t+\varphi(t))=\cos(2\pi f_C t)\cos\varphi(t)-\sin(2\pi f_C t)\sin\varphi(t).$$

Figure 6:
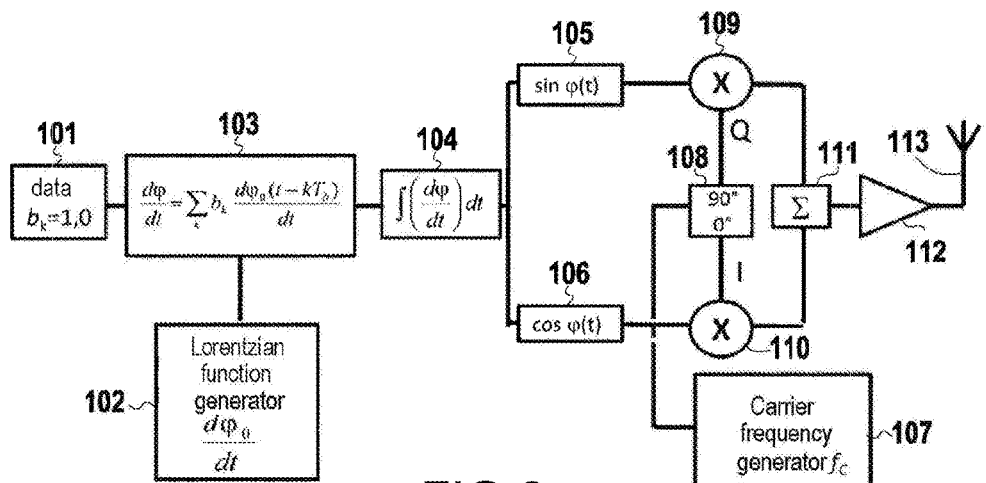
FIG. 6 shows the block diagram of an example of a digital coder device using single sideband phase modulation of the invention.

A block diagram of a device enabling such digital coding to be performed is given in FIG. 6.

In FIG. 6, there can be seen a module 101 for supplying data $b_k$=1 or 0, a Lorentzian function generator 102, a phase generator module 103, a phase integrator module 104, modules 105 and 106 respectively for generating the quantities cos φ(t) and sin φ(t), a carrier frequency generator 107, a phase shifter module 108, mixer circuits 109 and 110, and an adder circuit 111 for combining the quantities cos φ(t) and sin φ(t) with the in-phase and quadrature amplitudes cos $2\pi f_C t$ and sin $2\pi f_C t$ of the carrier in order to obtain the signal for transmission:

$$s(t)=\cos(2\pi f_C t+\varphi(t))=\cos(2\pi f_C t)\cos\varphi(t)-\sin(2\pi f_C t)\sin\varphi(t).$$

An output amplifier 112 is connected to a transmit antenna 113.

Consideration is given to the spectra of the single sideband phase coded signals.

Figure 7:
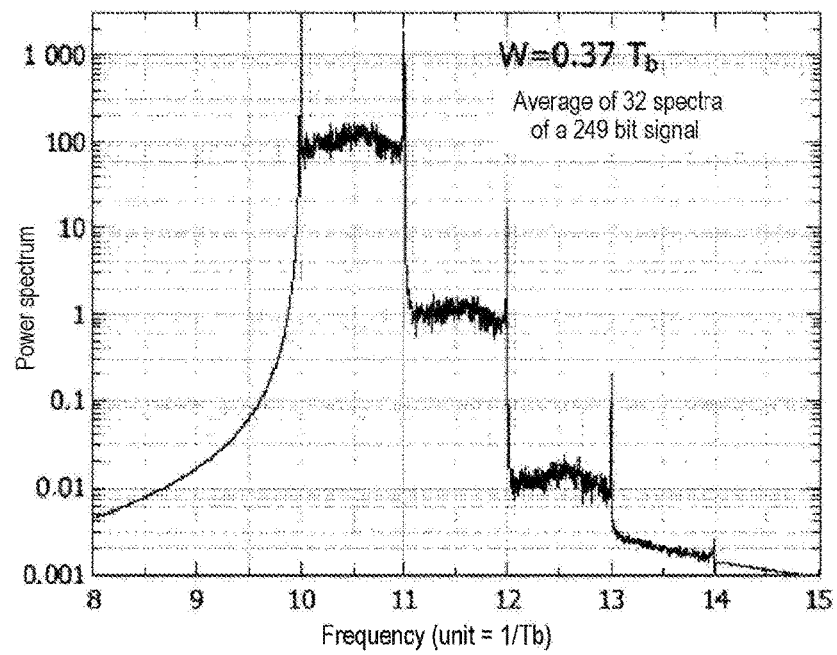
FIG. 7 shows a curve plotting signal spectrum density as a function of frequency for signals that have been single sideband coded in accordance with the invention, with a phase increment that is exactly equal to $2\pi$.

The spectral power of the signal is shown in FIG. 7 for a pulse width such that w/$T_b$=0.37. The frequencies are in units of 1/$T_b$. The carrier has a frequency equal to 10/$T_b$. Selecting some other carrier frequency would give a similar SSB spectrum relative thereto.

The spectrum shows clearly the single sideband property. To the left of the carrier frequency, the spectrum decreases extremely rapidly, its finite value being due only to finite size effects. To the right of the carrier frequency, the spectral power decreases abruptly by 20 dB at the frequency $f_C$+1/$T_b$, and then by a further 20 dB at the frequency $f_C$+2/$T_b$ and so on.

The compacting of the decrease at higher frequency is a result of the computation, which involves a finite number of samples (average of 32 spectra corresponding to independent draws of a series of 259-bit random numbers of duration $T_b$).

If a smaller width w/$T_b$ is selected, then the Fourier components extend to higher frequency. Specifically, the power decreases exponentially by $e^{-4\pi w/T_b}$ for an increase in frequency of 1/$T_b$, i.e. 1/100 (−20 dB) for w/$T_b$=0.37.

The spectrum also shows narrow peaks, referred to as spectrum lines, centered on the frequencies $f_C$, $f_C$+1/$T_b$, $f_C$+2/$T_b$, etc. These are due to selecting a phase increment that is exactly equal to 2π. This effect has already been noted for conventional phase modulation methods for which the increment is 2π, as indicated in the article by H. E. Rowe and V. K. Prabhu, entitled "*Power spectrum of a digital, frequency-modulation signal*", published in The Bell System Technical Journal, 54, No. 6, pages 1095-1125 (1975).

In the present method, it is important not to depart from this value since that would lead to the reappearance of a lower sideband in the spectrum.

Figure 8A:
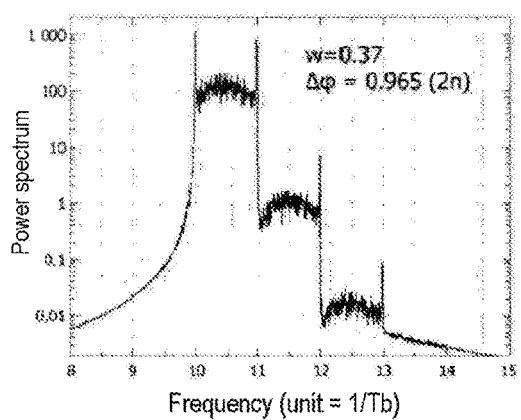
FIGS. 8A and 8B show curves plotting signal spectrum density as a function of frequency for signals that have been single sideband coded in accordance with the invention, with respective phase increments that are equal to $0.965\times2\pi$ and to $0.9123\times2\pi$.
Figure 8B:
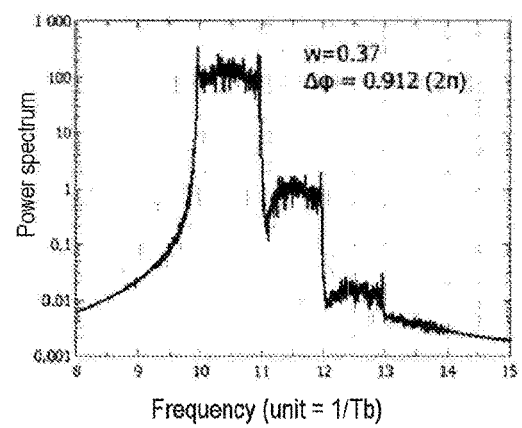

Nevertheless, in practice, this lower sideband in the spectrum remains negligible providing the increment is only a few percent less than or greater than 2π, while the narrow peaks in the spectrum are reduced or even eliminated. This is shown in FIG. 8A for a spectrum in which the phase increment is 0.965×2π. The reduction in the narrow peaks is accompanied by a noisy portion of the curve for frequencies in the range 9.5 to 10, revealing the appearance of a small but non-zero contribution in the lower sideband. For a phase increment of 0.9123×2π, the phenomenon is a little more marked (see FIG. 8B). For a phase increment less than 0.9 (2π) or greater than 1.1 (2π), it is considered that the SSB nature is lost.

Figure 9:
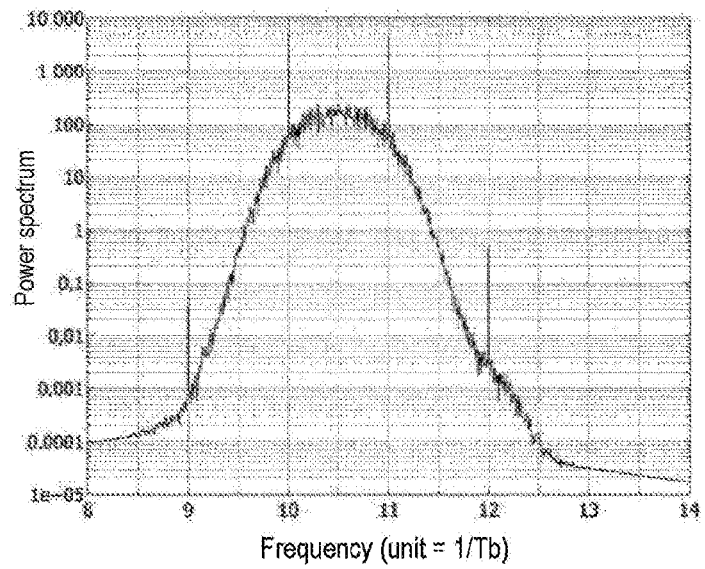
FIG. 9 shows a curve plotting signal spectrum density as a function of frequency for coded signals that are not single sideband signals, since compared with the formula that gave rise to the curve of FIG. 7, Lorentzian functions have been replaced by Gaussian functions.

Finally, FIG. 9 shows the spectrum that is obtained if the Lorentzian functions in dφ/dt are replaced by a Gaussian functions (while conserving the same phase increment and for comparable pulse width). The spectrum difference is striking. The presence of a lower sideband is very marked.

Figure 10:
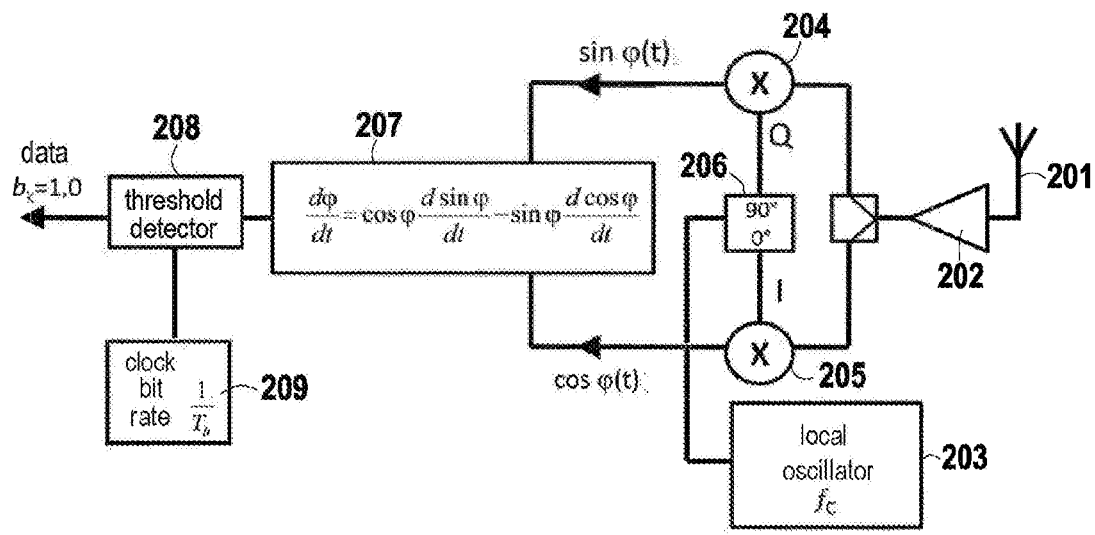
FIG. 10 shows the block diagram of an example device for demodulating a single sideband phase coded signal of the invention.

With reference to FIG. 10, there follows a description of an example method and device for demodulating the SSB phase coded signal in accordance with the invention.

On reception, by an antenna 201 and an amplifier 202, the first demodulation step for extracting the signal from the carrier is conventional. A local oscillator 203 of frequency $f_C$ associated with mixers 204 and 205 via a 0°-90° phase shifter 206 serves to obtain the in-phase and quadrature components $\cos(\varphi(t))$ and $\sin(\varphi(t))$ of the modulation signal. By differentiating them and multiplying them by their partners in a calculation module 207, the following phase derivative is obtained:

$$d\varphi/dt = \cos\varphi(t) d(\sin\varphi(t))/dt - \sin\varphi(t) d(\cos\varphi(t))/dt.$$

This makes it possible to reconstitute the series of Lorentzian pulses as initially generated, such as those of FIG. 5A. By placing a threshold detector 208 at a value of half the amplitude of a single Lorentzian function, it is easy to discriminate between the value of a bit $b_k=1$ or 0 at time $t_k=kT_b$. A clock 209 supplies pulses to the threshold detector 208 at a rate $1/T_b$.

In practice, detection noise is also added to the detected signal. Differentiating a signal, in this example $\sin\varphi$ and $\cos\varphi$, has the effect of increasing the effect of noise. It is possible to use other demodulation means that do not make use of differentiation, as described below, with reference to the orthogonality property of the single sideband phase pulses.

There follows a description of a method of generating single sideband orthogonal signals.

The object is to generate a set of orthogonal functions $u_h(t)$, $h=1, 2, 3, \ldots, N$ over the finite duration $T_b$, in order to use them, e.g. for data transmission at the rate $1/T_b$ per data channel.

In order to construct these orthogonal functions, it is useful to begin by considering the situation in which $T_b$ is infinite (single pulse).

The base of orthogonal functions is then:

$$u_h(t) = \frac{1}{\sqrt{2\pi}} e^{ih\varphi_0(t)} \sqrt{\frac{d\varphi_0(t)}{dt}} = \frac{1}{\sqrt{2\pi}} \frac{(t+iw)^{h-1}}{(t-iw)^h}$$

where use is made of the above-defined phase $\varphi_0(t) = 2\arctan(t/w)$.

For reasons of simplicity, the functions are centered on $t=0$. It can be verified that $$\int_{-\infty}^{+\infty} u_{h'}^*(t) u_h(t) dt = \delta_{h,h'}.$$

In practice, it may be more advantageous to consider the signals $$s_h(t) = e^{ih\varphi_0(t)} = \frac{(t+iw)^h}{(t-iw)^h}$$

and then to ensure two signals $s_h(t)$ and $s_{h'}(t)$ are orthogonally separated by performing the following integration:

$$\frac{1}{2\pi} \int_{-\infty}^{+\infty} s_{h'}^*(t) s_h(t) \frac{d\varphi_0}{dt} dt = \delta_{h,h'} \text{ where } \frac{d\varphi_0}{dt} = 2w/(t^2+w^2)$$

appears as a weight (or metric) for the integration.

With this definition, the signals $s_h(t)$ are at constant amplitude (unity modulus), which can present a practical advantage when generating them (constant transmission power). The spectrum of the $s_h(t)$ occupies a single sideband.

Generalization to orthogonal functions over a time interval $T_b$ that is no longer infinite, but rather finite, is obtained by considering the periodic series of phase pulses spaced apart by the duration $T_b$. This gives the following periodic signals:

$$s_h(t) = e^{ih\varphi_0(t,T_b)} = \left(\frac{\sin(\pi(t+iw)/T_b)}{\sin(\pi(t-iw)/T_b)}\right)^h.$$

The derivative of the phase $\varphi_0$ is a periodic sum of Lorentzian functions.

This sum may be re-written in the form of a periodic function:

$$\frac{d\varphi_0}{dt} = \frac{\pi}{T_b} \cdot \frac{sh(2\pi w/T_b)}{\sin^2(\pi t/T_b) + sh^2(\pi w/T_b)}.$$

Two signals differing by the integers h and h' satisfy an orthogonality relationship over the time interval $T_b$:

$$\frac{1}{2\pi} \int_{-T_b/2}^{+T_b/2} s_{h'}^*(t) s_h(t) \frac{d\varphi_0}{dt} dt = \delta_{h,h'}$$

once more $$\frac{d\varphi_0}{dt}$$

acts as a weight for the integration.

In practice $$\frac{d\varphi_0}{dt}$$

is calculated (or generated) and then integrated in order to give $\varphi_0(t,T_b)$ and then $s_h(t) = e^{ih\varphi_0(t,T_b)}$ is synthesized. It can be seen that merely multiplying the phase by an integer makes it possible to obtain a set of constant amplitude signals that are orthogonal. Furthermore, the spectrum, which is now discrete, conserves the single sideband of property.

There follows an application example for detecting phase-coded multi-level digital signals.

Consideration is given initially to selecting the multi-level phase coding.

The object is to code 2 bits on four levels, e.g. like the 2Binary-1Quaternary (2B1Q) method of amplitude modulation, but transposed to phase modulation.

Naturally, it is possible to generalize to N levels (N-ary bits) with $h=0, 1, \ldots, N-1$ and $N=2^p$. The bit rate per second is no longer $1/T_b$, as above, but becomes $p/T_b$.

It is possible to select $$\varphi(t) = \sum_k b_k \varphi_0(t - kT_b, T_b)$$

phase coding where the bit $b_k$ has values $b_k$=0, 1, 2, 3 (respectively for 00, 01, 10 and 11) and is defined in the time interval $(k-\frac{1}{2})T_b \le t < (k+\frac{1}{2})T_b$.

Thus, full use could be made of the orthogonality of the signals $s_{b_k}(t-kT_b) = e^{ib\varphi_0(t-kT_b,T_b)}$ over each time interval $[k-\frac{1}{2}, k+\frac{1}{2}]T_b$ in order to recover the value of the quaternary bit $b_k$ on demodulation. That is one possible application of the present invention.

However, for two consecutive bits $b_k$ and $b_{k+1}$ of different values, the derivative of the phase has a discontinuity equal to $(b_{k+1}-b_k)d\varphi_0(T_b/2,T_b)/dt$. Such discontinuities generate spectrum tails that decrease slowly. In the presently selected application example, preference is given to spectrum compactness at the cost of making poorer use of the orthogonality property. For this purpose, phase is coded as stated above with $$\varphi(t) = \sum_k b_k \varphi_0(t - kT_b) \text{ where}$$

$$\varphi_0(t) = \varphi_0(t, T_b = \infty) = 2 \arctan(t/w) \text{ and}$$

$$b_k = 0,1,2,3.$$

The derivative of the phase is thus a sum of Lorentzian functions of amplitude that takes on four value levels randomly. This coding ensures there is no phase discontinuity. Nevertheless, the signals $e^{ih\varphi_0(t)}$ do not satisfy orthogonality relationships with the functions $e^{ih'\varphi_0(t,T_b)}$ that are used on demodulation for retrieving the $b_k$, but rather they satisfy orthogonality relationships that are only approximate. Nevertheless, demodulation remains effective in practice.

The principle for data transmission is similar to that shown in FIGS. 5A and 5B, but in which the binary bits 0, 1 are replaced by the quaternary bits $b_k$=0, 1, 2, 3.

There follows a description of the spectrum of the multi-level phase-coded signal.

As a proposed application example, consideration is given to the spectrum of a signal made up of a run of 33 quaternary bits of duration $T_b$. The signal that is generated is as follows:

$$s(t) = \cos(2\pi f_C t + \varphi(t)), \text{ where } \varphi(t) = \sum_{k=-16}^{+16} b_k \varphi_0(t - kT_b).$$

The quaternary bits $b_k$=0, 1, 2, or 3 (corresponding to the binary bits 00, 01, 10, 11) are selected by using a pseudo-random number generator to represent a data sequence. The rate is $2/T_b$ bits per second. The frequency of the carrier is selected as $f_C=10/T_b$ and the width is selected as w=0.371.

Figure 11:
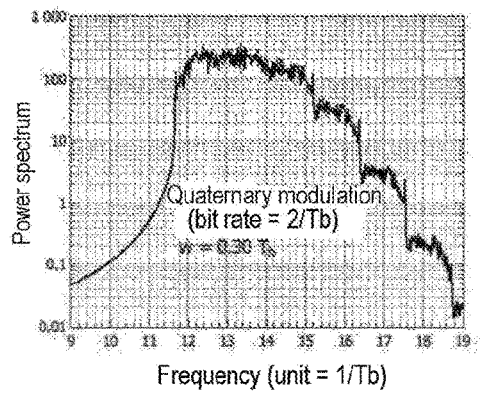
FIG. 11 shows a curve plotting the spectrum density of a multi-level phase coded signal that is averaged in accordance with an implementation of the invention.

FIG. 11 shows the average frequency spectrum corresponding to 32 different sequences of quaternary bits.

The single sideband nature is clearly apparent. The spectrum does not have any significant component for frequencies lower than the average carrier frequency $\langle f \rangle = f_C + \langle b_k \rangle / T_b = 11.5/T_b$.

For frequencies higher than $\langle f \rangle + 2/T_b$, the spectrum decreases rapidly and exponentially at about 10 dB for each $1/T_b$ (20 dB for a frequency increase equal to the bit rate $2/T_b$). A greater width w would give an even faster exponential decrease.

Figure 12:
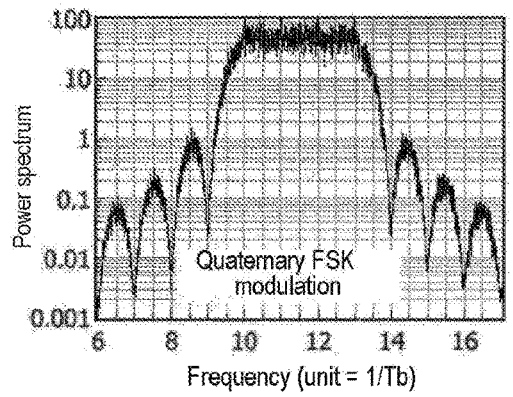
FIG. 12 shows a curve plotting the spectrum density of a multi-level phase coded signal as obtained using prior art phase shift modulation, the spectrum being of the double sideband type.

By way of comparison, the following graph shown in FIG. 12 is the result of modulation of the frequency shift keying (FSK) type in which frequency is modulated on four levels $$\left(\text{i.e. } d\varphi(t)/dt = 2\pi \sum_k b_k (1/T_b)\right).$$

In such a configuration that does not form part of the present invention, it can be seen that the spectrum is of the double sideband type on either side of the average carrier frequency $\langle f \rangle = f_C + \langle b_k \rangle / T_b = 11.5/T_b$. Its main width is $2/T_b$, but the spectrum is flanked by spectrum tails that decrease slowly and not exponentially.

There follows a description of a method and a device for demodulating signals on a base of orthogonal periodic signals.

On reception, the first step of demodulation for extracting the signal from the carrier is conventional and similar to the example given above with reference to FIG. 10. The signal received by an antenna 301 is amplified in an amplifier 302. A local oscillator 303 of frequency $f_C$ associated with mixers 304 and 305 via a 0°-90° phase shifter 306 serves to obtain the in-phase and quadrature components $\cos(\varphi(t))$ and $\sin(\varphi(t))$ of the modulation signal. In a first embodiment, it would be possible to use the same scheme as in FIG. 10 to obtain the derivative of the phase of the modulated signal. Nevertheless, detecting for amplitude levels (including zero amplitude) would appear to be difficult because of the overlap between the Lorentzian functions of different attitudes transmitted at neighbouring instants.

Thus, a preferred solution is to use the following base of periodic orthogonal signals $$s_h(t) = e^{ih\varphi_0(t,T_b)} = \left(\frac{\sin(\pi(t+iw)/T_b)}{\sin(\pi(t-iw)/T_b)}\right)^h.$$

In practice, the four levels h=0, 1, 2, and 3 of quaternary bits are detected separately. This is achieved by using appropriate demodulation means given reference 307 in FIG. 13 to form the four quantities $$R_h(t) = (\cos(\varphi(t) - h\varphi_0(t, T_b)))\frac{d\varphi_0}{dt} \text{ and}$$

$$I_h(t) = (\sin(\varphi(t) - h\varphi_0(t, T_b)))\frac{d\varphi_0}{dt}$$

and then by using a module 308 to perform convolution with a gate function of time width $T_b$ giving:

$$\overline{R_h}(t) = \int_{t-T_b/2}^{t+T_b/2} R_h(t-\tau)d\tau \text{ and } \overline{I_h}(t) = \int_{t-T_b/2}^{t+T_b/2} I_h(t-\tau)d\tau$$

Thereafter, in a module 309, the quantity $\overline{R_h}(t)^2 + \overline{I_h}(t)^2$ is calculated. A peak observed in this quantity (which constitutes a bit level h detection signal) at an instant $t=kT_b$ for the level $h=0$, 1, 2, or indeed 3 indicates that the bit $b_k$ is equal to h.

Four threshold detectors 310 to 313 are thus used for the levels $h=0$, 1, 2, and 3 respectively.

A clock 314 serves to deliver pulses at a rate of $1/T_b$.

Figure 13:
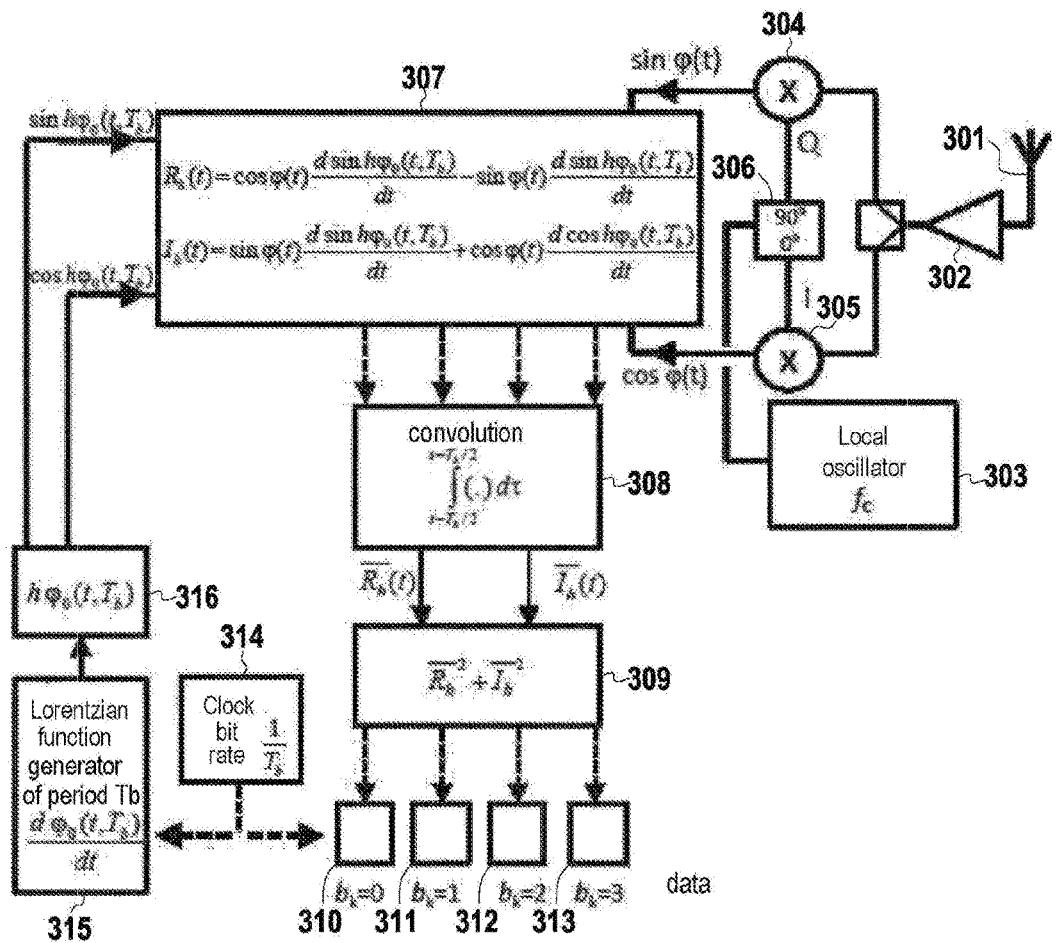
FIG. 13 shows the block diagram of an example device for demodulating signals by a base of orthogonal periodic signals, of the invention.
Figure 14A:
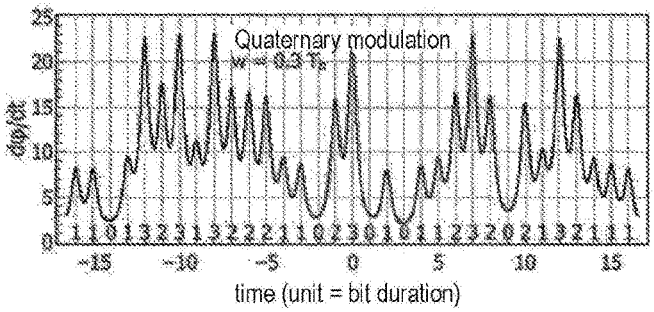
FIGS. 14A to 14E show curves representing a starting signal, followed by four graphs representing the selective data detection signal at levels 3, 2, 1, and 0 respectively, in the context of a method of demodulating signals by a base of orthogonal periodic signals of the invention.
Figure 14B:
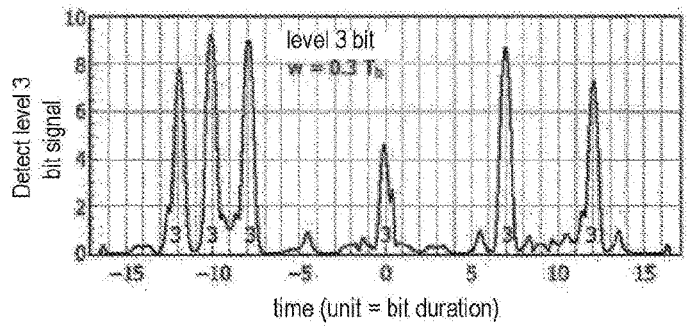
Figure 14C:
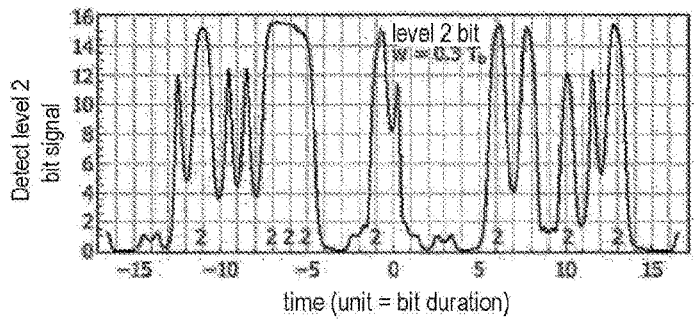
Figure 14D:
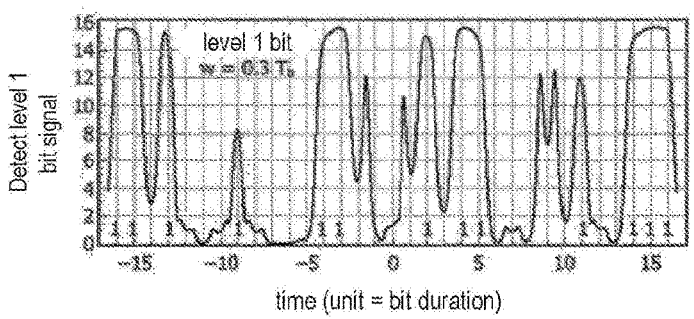
Figure 14E:
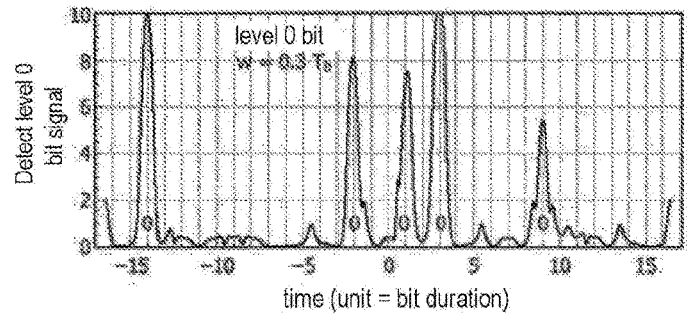

FIG. 13 also shows a generator of periodic Lorentzian functions of period $T_b$ and a calculation module 316 for supplying the module 307 with the values $\sin(h\varphi_0(t,T_b))$ and $\cos(h\varphi_0(t,T_b))$.

FIGS. 14A to 14E show from bottom to top: the starting signal $$d\varphi/dt = \sum_{k=-16}^{+16} b_k d\varphi_0(t-kT_0)/dt$$

(FIG. 14A); followed by four graphs showing the selective detection signals for detecting bits of levels $h=3, 2, 1,$ and 0 (FIGS. 14B to 14E).

The information to be taken into consideration for a multi-level bit $b_k$ is given by the values of the detection signals taken at exactly $t=kT_b$. For example, for $k=-8$, the level of the signal detected for $h=3$ (FIG. 14B) takes on a large value and shows a peak, while for the graphs corresponding to $h=0$, 1, and 2 (FIGS. 14E, 14D, and 14C), the signal levels are low: the bit $b_{k=-8}$ thus has the value 3 (or 11). For the levels $h=1$ and 2 (FIGS. 14D and 14C), there can sometimes also be found significant values for integer $t/T_b$ that do not correspond to peaks, but rather to troughs, and that are not taken into consideration for identifying the value of $b_k$. For example for $k=-2$, $b_k=0$ is identified by a peak for the detection signal with $h=0$ (FIG. 14E), while the value of the detection signal with $h=1$ (FIG. 14D) gives a value that is not zero but that is associated with a trough.

In spite of the large amount of overlap of the Lorentzian functions, it can be seen that the method consisting in projecting the signal onto the base of periodic signals makes it possible to sort the bits selectively depending on their levels in a manner that is very effective.

Consideration is given once more to demodulating the phase coded binary signal as given above by way of example.

As mentioned above, reconstituting the in-phase derivative cannot be effective when the detected signals are noisy. The demodulation method making use of the orthogonality property, as explained above for quaternary bits, is preferable and applies even more effectively for a binary signal.

As before, detection consists in calculating:

$$(\int_{t-T_b/2}^{t+T_b/2} \cos(\varphi(t)-h\varphi_0(t,T_b))d\varphi_0/dt)^2 + (\int_{t-T_b/2}^{t+T_b/2} \sin(\varphi(t)-h\varphi_0(t,T_b))d\varphi_0/dt)^2$$

where now $h=1$ or 0 and $$\varphi(t) = \sum_{k=-16}^{+16} b_k \varphi_0(t-kT_b).$$

Figure 15A:
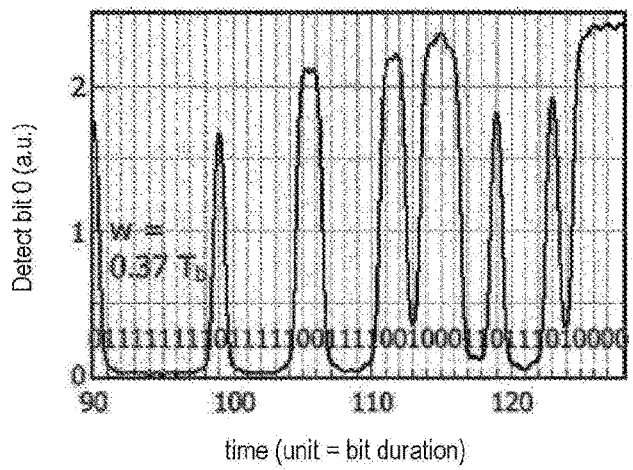
FIGS. 15A to 15C show curves representing firstly a phase derivative signal used for generating a signal to be detected, and secondly a signal for detecting bits of value 0 and of value 1 in the context of a method of demodulating a phase-coded binary signal of the invention.
Figure 15B:
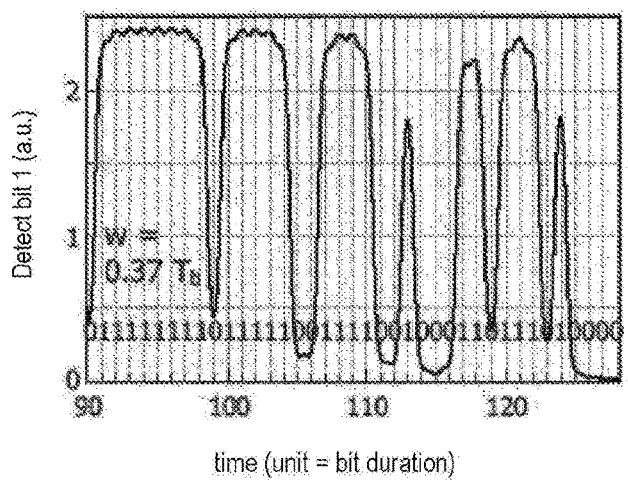
Figure 15C:
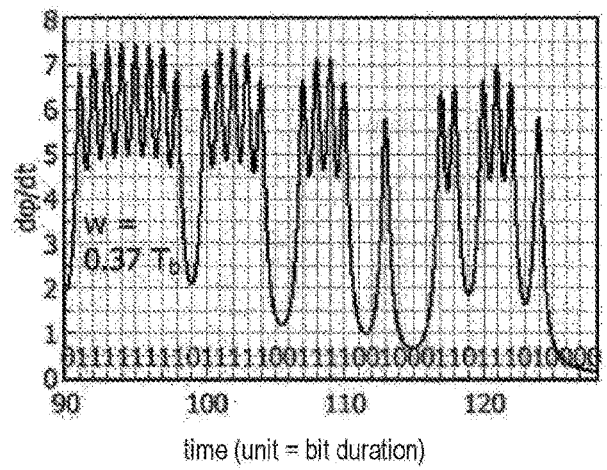

Once again, $\varphi_0(t)$ does not satisfy an orthogonality relationship with $\varphi_0(t,T_b)$ but the overlap is sufficient for effective demodulation. FIGS. 15A to 15E show, for the last 38 bits of the sequence of 259 bits shown in FIG. 4, the detection signal for bits of value 0 (FIG. 15A) and of value 1 (FIG. 15B). FIG. 15C reproduces the in-phase derivative signal that was used for generating the signal to be detected.

The present invention lends itself to various other applications, and in particular to in-phase and out-of-phase transmission of phase-coded binary signals in single sideband.

In this application, it is proposed to take advantage of the possibility of modulating the in-phase and the quadrature components of the carrier independently in order to double the data rate (i.e. in order to have a bit rate that is equal to twice the symbol rate).

In the above examples, the signals are of constant power (or amplitude) with:

$$s(t) = \cos(2\pi f_C t + \varphi(t)) \text{ and } \varphi(t) = \sum_k b_k \varphi_0(t-kT_b)$$

In the present example, since the signal is the sum of two amplitudes, it is no longer at constant amplitude:

$$s(t) = \cos(2\pi f_C t + \varphi_1(t)) + \sin(2\pi f_C t + \varphi_2(t))$$

In this example $$\varphi_1(t) = \sum_k b_{k,1}\varphi_0(t-kT_b) \text{ and } \varphi_2(t) = \sum_k b_{k,2}\varphi_0(t-kT_b),$$

where two independent sets of bits $b_{k,1(2)}$ are used in order to double the rate.

Figure 17:
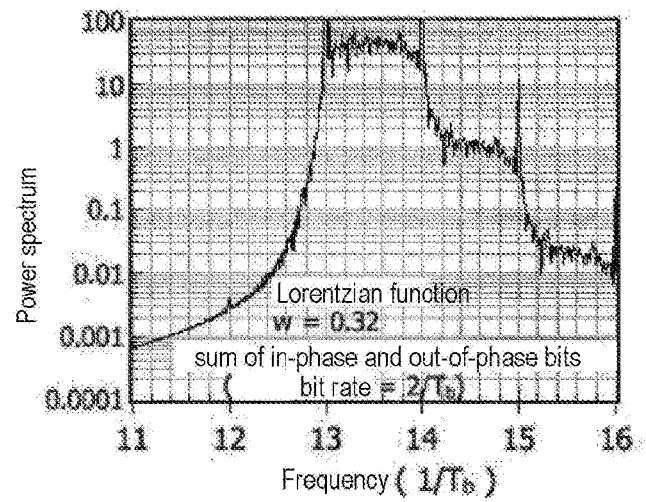
FIG. 17 shows a curve plotting the spectrum density of single sideband phase coded binary signals of the invention, as shown in the examples of FIGS. 16A and 16B.
Figure 19:
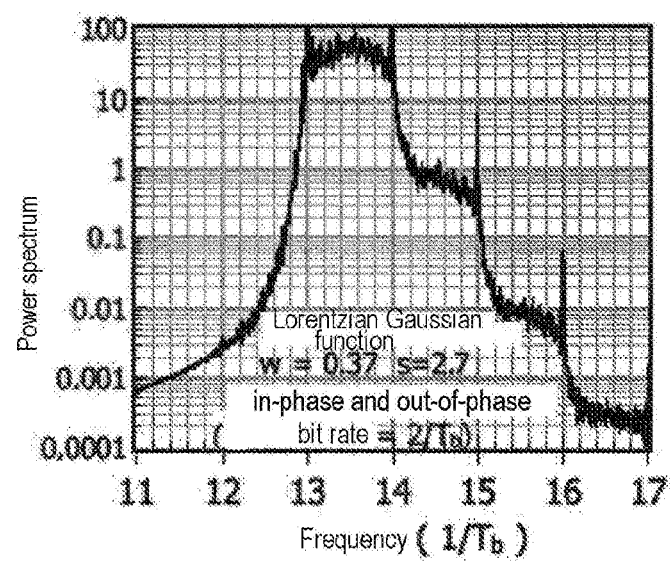
FIG. 19 shows a curve plotting the spectrum density of single sideband phase coded binary signals in accordance with the invention, as shown in the examples of FIGS. 18A and 18B.

Since the spectra for the out-of-phase and in-phase amplitudes are both single sideband, the total signal continues to present the single sideband property (see FIGS. 17 and 19).

There follows an explanation of the demodulation procedure for retrieving the information on the transmitted bits.

For simplification purposes, this explanation is restricted to binary bits. For good demodulation, it is shown that the relative phase variations of $\varphi_1(t)$ and of $\varphi_2(t)$ need to remain small. These variations come from the interference (overlap) between adjacent phase pulses (also known as "intersymbol interference" (ISI)), a constraint that does not apply to the example of FIGS. 3A and 3B.

On demodulating the carrier, the in-phase and out-of-phase parts are obtained, i.e. respectively:

$$Re(t) = \cos(\varphi_1(t)) - \sin(\varphi_2(t))$$

$$Im(t) = \sin(\varphi_1(t)) + \cos(\varphi_2(t))$$

When $w \ll T_b$ (no ISI), for $t=kT_b$, the real part $Re(kT_b) = \cos(b_{k,1}\pi) - \sin(b_{k,2}\pi)$ gives 1 or $-1$ for $b_{k,1}=0$ or 1 respectively and independently of the value of $b_{k,2}$.

Likewise, the imaginary part: $Im(kT_b) = \sin(b_{k,1}\pi) + \cos(b_{k,2}\pi)$ gives 1 or $-1$ for $b_{k,2}=0$ or 1 respectively, independently of the value of $b_{k,1}$.

$R_e$ gives information about the first set of bits and $I_m$ gives information about the second set of bits. When $w/T_b$ is greater, an additional phase $$\theta_1 = \sum_{k' \neq k} b'_{k,1}\varphi_0((k'-k)T_b)$$

is added to the expected phase in $T_b$ $\varphi_1(kT_b) = b_{k,1}\pi + \theta$. In similar manner, a phase $\theta_2$ affects $\varphi_2$. This gives:

$$Re(kT_b) = \cos(b_{k,1}\pi + \theta_1) - \sin(\theta_2)$$

$$Im=(kT_b) = \sin(\theta_1) + \cos(b_{k,2}\pi + \theta_2)$$

In order to recover each of the bits transmitted at time $kT_b$ without error, it is essential for $|\theta_1| \ll \pi/4$ and $|\theta_2| \ll \pi/4$ (i.e. to ensure that Re and Im always have a value that is significantly positive (bit 0) or negative (bit 1) but never close to 0).

If time filtering of $d\varphi/dt$ is used to limit the ISI to bits transmitted at times lying in the range $(k \pm N)T_b$, then:

$$|\theta_{1,2}|^{MAX} \approx (\gamma + \ln(N))w/T_b \ll \pi/4;$$

where $\gamma = 0.577\ldots$ is Euler's constant. In practice this gives $N \ll 4.7$ for $w/T_b = 0.37$, $N \ll 6.5$ for $w/T_b = 0.32$ and $N \ll 39$ for $w/T_b = 0.185$. Under all circumstances, time filtering is necessary to limit interference between adjacent phase pulses.

Some examples are given below.

One way of limiting ISI is to use a Lorentzian-Gaussian function for the phase derivative, as mentioned above with reference to FIGS. 3A and 3B, with the elementary phase pulse obtained by integrating:

$$d\varphi_{0,s}(t)/dt = \mu \exp(-t^2/2s^2)w/(t^2+w^2)$$

where the parameter p is a coefficient that makes it possible to conserve a total phase increment equal to $2\pi$.

Figure 16A:
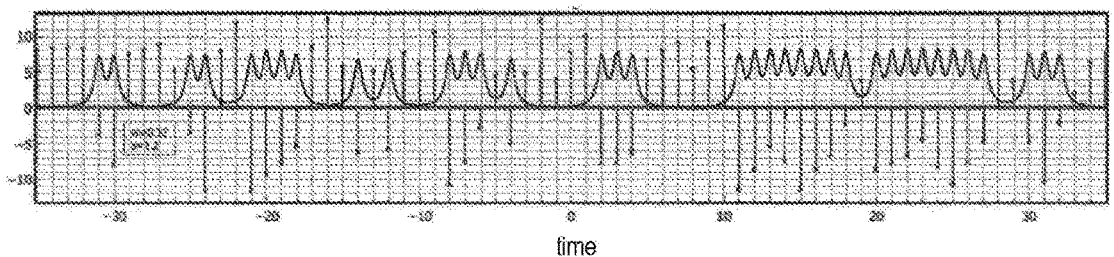
FIGS. 16A and 16B show, for a method of transmitting single sideband phase-coded binary signals in-phase and out-of-phase in accordance with the invention, respectively the real and imaginary parts of a detected (or demodulated) signal for a series of bits in a first implementation, the phase derivative modulation of the coded signal being included in each graph.
Figure 16B:
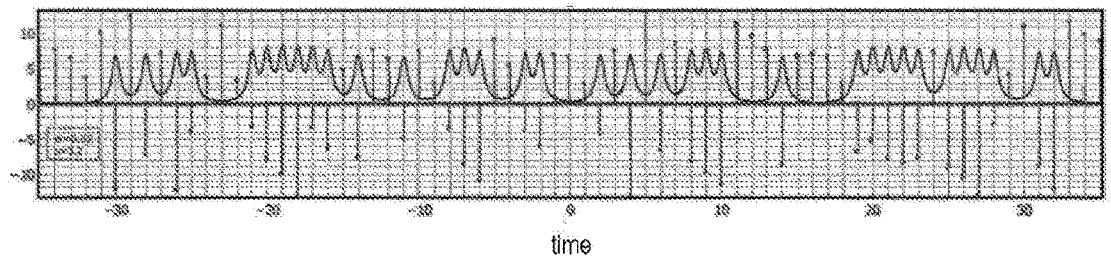

FIGS. 16A and 16B show the signals Re (FIG. 16A) and Im (FIG. 16B) in arbitrary units for a series of bits with $w/T_b = 0.32$ and $s/T_b = 3.2$ ($\mu = 1.0811$) together with:

$$d\varphi_1(t)/dt = \sum_k b_{k,1} d\varphi_{0,s}/dt \text{ and } d\varphi_2(t)/dt = \sum_k b_{k,2} d\varphi_{0,s}/dt$$

The corresponding frequency spectrum for a carrier frequency $f_C = 13$ (units of $1/T_b$) is shown in FIG. 17.

The SSB nature is well conserved, apart from a small spectrum component in the lower sideband, given that the elementary phase derivative is no longer strictly a Lorentzian function. It can also be seen that 90% of the spectrum is concentrated in a $1/T_b$ frequency band, i.e. half the bit rate.

Figure 18A:
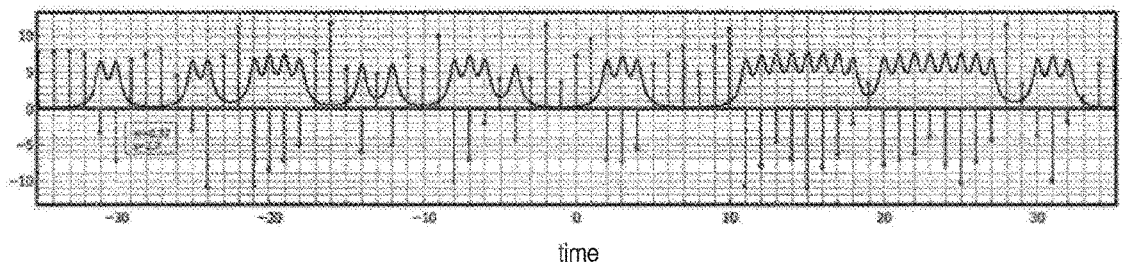
FIGS. 18A and 18B show, for a method of transmitting single sideband phase-coded binary signals in-phase and out-of-phase in accordance with the invention, respectively the real and imaginary parts of a detected (or demodulated) signal for a series of bits in a second implementation, the phase derivative modulation of the coded signal being included in each graph.
Figure 18B:
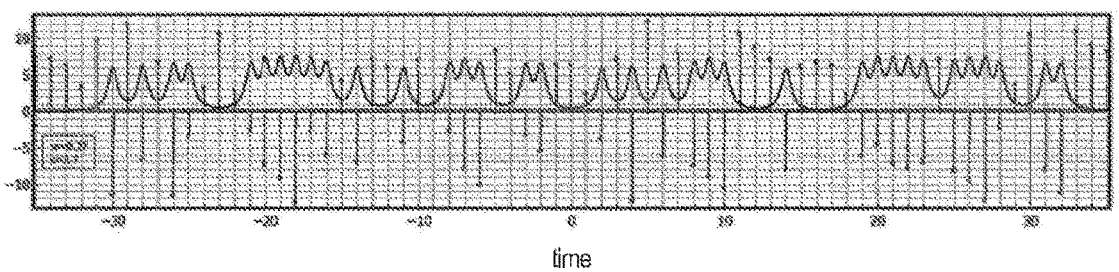

The following example shows that it is possible to reach 98% of the spectrum in a frequency band equal to half the bit rate using the following parameters: $w/T_b = 0.37$ and $s/T_b = 2.7$ ($\mu = 1.112$). FIGS. 18A and 18B show the signals Re (FIG. 18A) and Im (FIG. 18B) and FIG. 19 shows the spectrum.

These two examples show that a very high spectrum efficiency (ratio of the bit rate over the spectrum width) of about 2 bits per second per hertz (bit/s/Hz) can be obtained with a very compact SSB spectrum.

There follows a description of an application to single sideband combined amplitude-and-phase modulation.

A direct application of the present invention consists in modulating the carrier signal simultaneously in amplitude and in phase.

In the description above, consideration is given only to phase modulation $\varphi(t)$. The principle is to manage one pulse of the signal, i.e. a signal that starts and then returns to zero. For a single pulse is centered on $t_0$ and of width $w_0$, and for the elementary phase pulse $\varphi(t) = \varphi_0(t) = 2 \arctan((t-t_0)/w_0)$:

$$s(t) = \cos(2\pi f_C t) + \cos(2\pi f_C t + \varphi_a(t))$$

The signal may also be written in the form of amplitude modulation $\cos(\varphi_0(t)/2)$ and of phase modulation $\varphi_0(t)/2$:

$$s(t) = 2 \cos(\varphi_0(t)/2)\cos(2\pi f_C t + \varphi_0(t)/2).$$

It is thus possible to generalize for pulses where $\varphi(t) = h\varphi_0(t)$ ($h = 1, 2, 3, \ldots$) with:

$$s(t) = \cos(2\pi f_C t) - (-1)^h \cos(2\pi f_C t + h\varphi_a(t))$$

Figure 20A:
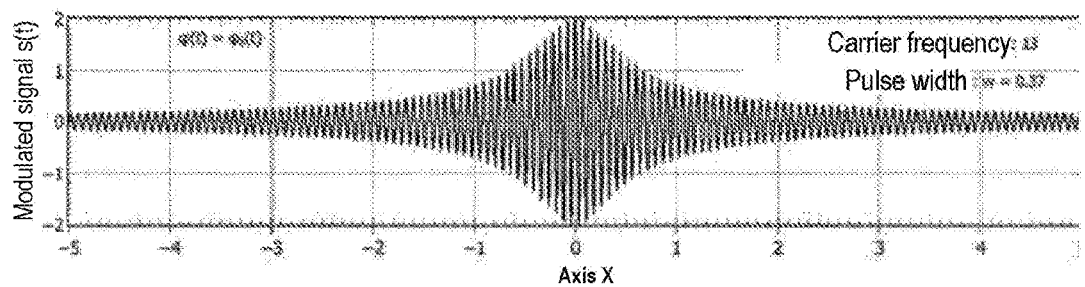
FIGS. 20A to 20C show curves plotting a single sideband combined amplitude-and-phase modulated signal in an implementation of the invention, for values of the modulation index h that are respectively equal to 1, 2, and 3.
Figure 20B:
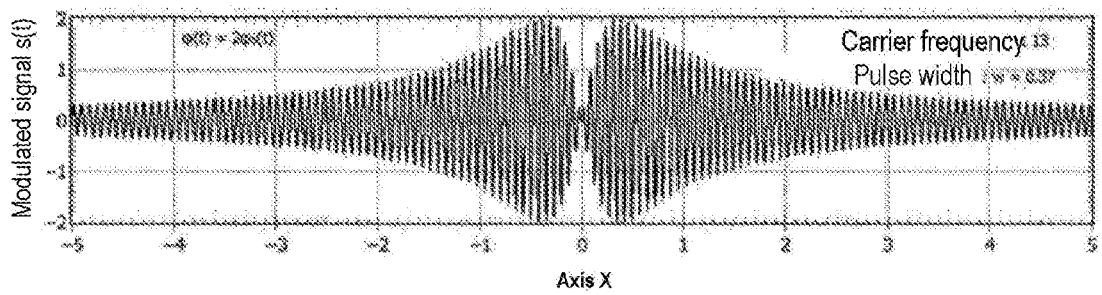
Figure 20C:
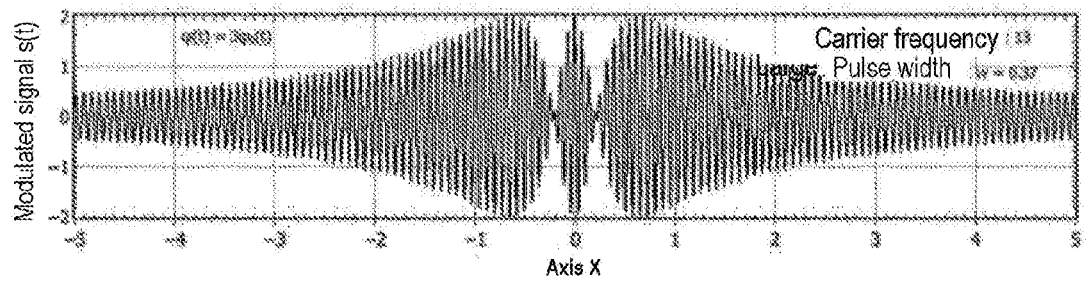

FIGS. 20A to 20C show the signal s(t) respectively for h=1, 2, and 3 and pulse width modulation $w/T_b = 0.37$ with a carrier $f_C = 13$. The time signals are mutually orthogonal.

The resulting spectrum is given by the sum of the SSB spectrum ($\cos(2\pi f_C t + \varphi(t))$ term) plus the spectrum localized at the frequency $f_C$ ($\cos(2\pi f_C t)$ term), so it is indeed a single sideband spectrum. It is identical to the spectrum given in FIGS. 1A to 1C, for h=1, 2, and 3 respectively, with the exception of a strengthening at the frequency $f_C$.

There follow a few practical examples of single sideband phase pulse generators.

It is possible to synthesize the carrier and its modulation in all-digital manner: in the present state of the art, for phase pulses generated at a rate of up to several million pulses per second, and for carriers up to GHz order, digital methods are available making use of dedicated fast processors (known as "digital signal processors" (DSPs)), or of reconfigurable fast processors (known as "field programmable gate arrays" (FPGAs)).

At lower bit rates, at present less than 1 million pulses per second, but potentially increasing with technological progress, it is possible to use inexpensive solutions based on "software radio" cards. After digital-to-analog conversion, the quantities $\sin \varphi(t)$ and $\cos \varphi(t)$ are generated and then sent separately to the mixers, as in the embodiment of FIG. 6 in order to multiply the in-phase part and the quadrature part of the carrier.

By way of alternative, still using digital synthesis, the phase $\varphi(t)$ is calculated followed by digital-to-analog conversion and then sent to a voltage-controlled phase shifter or an oscillator.

It is also possible to perform analog synthesis. Under such circumstances, by using an elementary phase $\varphi_{0,s}(t)$ such that the overlap between phase pulses separated by $2NT_b$ is negligible, $d\varphi(t)/dt$ is synthesized by generating 2N periodic sequences of pulses $d\varphi_{0,s}(t)/dt$ of period $2NT_b$, each sequence being offset in time from the preceding sequence by $T_b$. The periodic sequence $$d\varphi_{0,s}^q(t)/dt = \sum_{k=-\infty}^{+\infty} d\varphi_{0,s}(t-(k+q)T_b)/dt, -N \leq q < N;$$

is easy to synthesize by generating frequency harmonics that are multiples of $\frac{1}{2}NT_b$ with the appropriate phase and amplitude.

In the time interval $$(k-N+\tfrac{1}{2})/2T_b \leq t < (k+N-\tfrac{1}{2})/T_b$$

the bits are de-multiplexed in order to index them as $b_{k+q}$ and by using the gate function $\Pi(t)$ of width $2NT_b$ it is possible to construct the total phase derivative:

$$d\varphi(t)/dt = \sum_{q=-N}^{+N} b_{k+q} \Pi(t-(k+q)T_b) d\varphi_{0,s}(t-(k+q)T_b)/dt$$

This procedure for generating periodic pulses by synthesizing harmonics at frequencies that are multiples of $\frac{1}{2}NT_b$ can easily be performed in the frequency domain up to tens of GHz by cascading frequency multipliers, or by using frequency comb generators for generating base harmonics.

Figure 21:
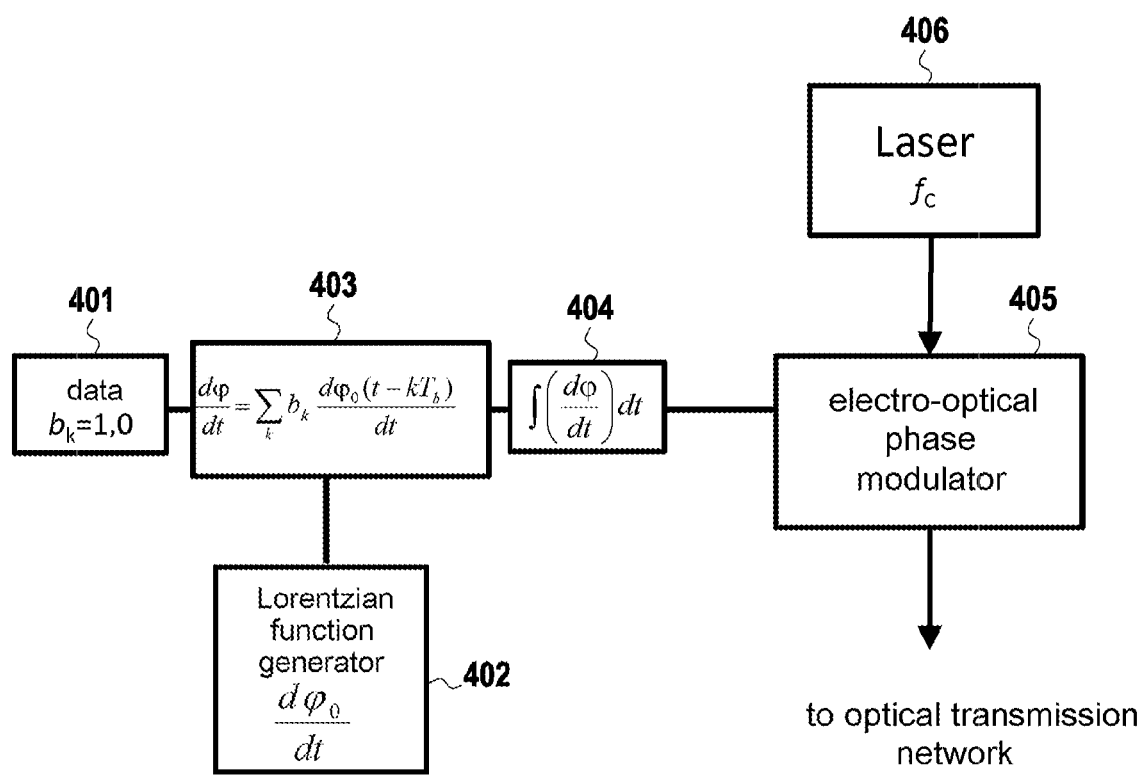
FIG. 21 shows the block diagram of an example of a digital coder device using single sideband phase modulation of the invention in the context of an application to the optical field.

In the optical domain, it is possible to modulate the phase of the wave directly with electro-optical modulators, the voltage applied to the modulator being proportional to the phase variation, as shown in the embodiment of FIG. 21.

In FIG. 21, there can be seen a module 401 for supplying data $b_k=1$ or 0, a Lorentzian function generator 402, a phase generator module 403, a phase integrator module 404, a laser generator 406 for generating the carrier frequency, and an electro-optical phase modulator 405 that serves to modulate the phase of the wave directly in such a manner that, under the effect of a voltage representing the desired phase variation, an SSD phase modulated optical signal is generated in the modulator 405 for transmission in the optical communications network.

Various modifications and additions may be applied to the embodiments described without going beyond the ambit defined by the accompanying claims.

In particular, various embodiments may be combined with one another, providing there is no mention to the contrary in the description.

The invention claimed is:

1. A method of phase, modulation comprising:
creating a set of signals $s_h(t)$ constituted by a carrier wave of carrier frequency $f_C$ and of phase $\varphi(t)=h\varphi_0(t)$ that is modulated in time t in such a manner that $s_h(t)=\cos(2\pi f_C t+h\varphi_0(t))$, where h is an integer and where $\varphi_0(t)=2\arctan((t-t_0)/w_0)$, wherein the modulation of the carrier wave corresponds to a single phase pulse centered on a time $t_0$ and having a positive characteristic duration $w_0$;
incrementing the phase of the set of signals $s_h(t)$ by the quantity $h2\pi$; and
generating a single sideband frequency spectrum directly from the phase-incremented set of signals.

2. The method according to claim 1, wherein the carrier wave is of electromagnetic type.

3. The method according to claim 1, wherein the carrier wave is of acoustic type.

4. The method according to claim 1, comprising:
determining that a $k^{th}$ information bit of duration $T_b$ contributes the quantity $2 b_k \arctan((t-kT_b)/w)$ to the total phase $\phi(t)$ of the carrier wave, where $b_k=1$ or 0, and where the width w is comparable to or smaller than the symbol duration $T_b$, or else considering that the derivative of the phase $\phi(t)$ is a sum of Lorentzian functions $2w/((t-kT_b)^2+w^2)$ centered on $kT_b$ and weighted by the information bit $b_k$;
integrating the phase $\phi(t)$;
phase modulating the carrier wave using the integrated phase $\phi(t)$;
calculating in phase and quadrature components of the phase $\phi(t)$ as $\cos \varphi(t)$ and $\sin \varphi(t)$;
calculating in-phase amplitude $\cos 2\pi f_C t$ and quadrature amplitude $\sin 2\pi f_C t$ of the carrier wave; and
generating the set of signals $s_h(t)$ according to:

$$s_h(t)=\cos(2\pi f_C t+\varphi(t))=\cos(2\pi f_C t)\cos \varphi(t)-\sin(2\pi f_C t)\sin \varphi(t).$$

5. The method according to claim 1, comprising:
independently modulating an in-phase component and a quadrature component of the carrier wave;
generating the set of signals $s_h(t)$ according to:

$$s_h(t)=\cos(2\pi f_C t+\varphi_1(t))+\sin(2\pi f_C t+\varphi_2(t))$$

with the phases $$\varphi_1(t)=\sum_k b_{k,1}\varphi_0(t-kT_b) \text{ and } \varphi_2(t)=\sum_k b_{k,2}\varphi_0(t-kT_b),$$

where bits $b_{k,1(2)}$ represent two independent sets of bits used to double the bit rate, the spectrum of each of the out-of-phase and in-phase components being a single sideband spectrum.

6. The method according to claim 1, comprising:
generating the set of signals $s_h(t)$ according to:

$$s_h(t)=\cos(2\pi f_C t)-(-1)^h \cos(2\pi f_C t+h\varphi_\alpha(t)).$$

7. A device for demodulating a single sideband phase coded signal, the device comprising:
a local oscillator of frequency $f_C$;
first and second mixers; and
a 0°-90° phase shifter configured to obtain respectively the in-phase and quadrature components $\cos(\varphi(t))$ and $\sin(\varphi(t))$ of a modulation signal;
a circuit configured to differentiate each of the in-phase and quadrature components $\cos(\varphi(t))$ and $\sin(\varphi(t))$ of the modulation signal and to generate a phase derivative as:

$$d\varphi/dt=\cos \varphi(t)d(\sin \varphi(t))/dt-\sin \varphi(t)d(\cos \varphi(t))/dt;$$

and a circuit for reconstituting an initially generated series of Lorentzian function pulses, the circuit comprising a threshold detector with a value of half the amplitude of a single Lorentzian function pulse so as to discriminate the value of a bit $b_k=1$ or 0 at a time $t_k=kT_b$.

8. A device for demodulating signals by a base of orthogonal periodic signals comprising four amplitude levels including zero amplitude, the device comprising:
a local oscillator of frequency;
first and second mixers;
a 0°-90° phase shifter configured to obtain respectively the in-phase and quadrature components $\cos(\varphi(t))$ and $\sin(\varphi(t))$ of a modulation signal;
a detector configured to separately detect the four levels h=0, 1, 2, and 3 of quaternary bits by using a demodulator associated with a Lorentzian function generator of period $T_b$, to form the following two quantities for each of the four amplitude levels:

$$R_h(t) = (\cos(\varphi(t) - h\varphi_0(t, T_b)))\frac{d\varphi_0}{dt} \text{ and}$$

$$I_h(t) = (\sin(\varphi(t) - h\varphi_0(t, T_b)))\frac{d\varphi_0}{dt}$$

a circuit configured to convolve the two formed quantities $R_h(t)$ and $I_h(t)$ with a gate function of time width $T_b$ giving:

$$\overline{R_h}(t) = \int_{t-T_b/2}^{t+T_b/2} R_h(t-\tau)d\tau \text{ and}$$

$$\overline{I_h}(t) = \int_{t-T_b/2}^{t+T_b/2} I_h(t-\tau)dt$$

a circuit configured to calculate the quantity $\overline{R_h}(t)^2+\overline{I_h}(t)^2$; and
a threshold detector configured to determine that a peak observed in the quantity $\overline{R_h}(t)^2+\overline{I_h}(t)^2$ at an instant $t=kT_b$ for the level h=0, 1, 2, or else 3 indicates that the bit $b_k$ is equal to h.

9. A device for generating single sideband (SSB) phase pulses in the optical domain, the device comprising:
a circuit configured to supply data $b_k=1$ or 0;
a Lorentzian function generator;
a phase generator circuit;
a phase integrator circuit;

a laser generator configured to generate a carrier frequency; and an electro-optical phase modulator configured to modulate the phase of a carrier wave directly, under the effect of a voltage proportional to a desired phase variation, to generate an SSB phase modulation optical signal for transmission over an optical communications network.

\* \* \* \* \*